(12) United States Patent
Numai

(10) Patent No.: US 6,566,155 B1
(45) Date of Patent: May 20, 2003

(54) METHOD OF MANUFACTURING SEMICONDUCTOR DEVICE AND GYRO

(75) Inventor: Takahiro Numai, Ninomiya-machi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/551,353

(22) Filed: Apr. 18, 2000

(30) Foreign Application Priority Data

| Apr. 19, 1999 | (JP) | 11-111022 |
| Jul. 30, 1999 | (JP) | 11-217411 |
| Apr. 11, 2000 | (JP) | 2000-109712 |

(51) Int. Cl.$^7$ .................................................. H01L 21/00
(52) U.S. Cl. ........................................... 438/31; 438/47
(58) Field of Search ............................. 438/31, 32, 33, 438/39, 40, 46, 47

(56) References Cited

U.S. PATENT DOCUMENTS

| 4,431,308 | A | | 2/1984 | Mitsuhashi et al. ......... 356/350 |
| 4,694,460 | A | | 9/1987 | Hayakawa et al. ............ 372/45 |
| 5,266,518 | A | * | 11/1993 | Binsma et al. ................. 438/40 |
| 5,759,872 | A | | 6/1998 | Van Roijen et al. ........... 438/23 |
| 5,764,681 | A | | 6/1998 | Ballantyne et al. ........... 372/94 |
| 6,143,583 | A | * | 11/2000 | Hays ............................. 438/39 |
| 2001/0036681 | A1 | * | 11/2001 | Iwai et al. ..................... 438/31 |

FOREIGN PATENT DOCUMENTS

| JP | 57-43486 | 3/1982 |
| JP | 62-39836 | 2/1987 |
| JP | 4-174317 | 6/1992 |
| JP | 5-7019 | 1/1993 |

* cited by examiner

Primary Examiner—Chandra Chaudhari
(74) Attorney, Agent, or Firm—Fitzpatrick, Cella, Harper & Scinto

(57) ABSTRACT

A method of manufacturing a semiconductor device comprising the steps of preparing a member having at least one semiconductor layer on a substrate, forming an electrode layer on the semiconductor layer, forming an etching mask on the electrode layer, and forming a mesa profile by etching the electrode layer and the semiconductor layer.

12 Claims, 19 Drawing Sheets

METHOD OF MANUFACTURING SEMICONDUCTOR DEVICE AND GYRO

BACKGROUND OF THE INVENTION

1. Field of the Invention

This invention relates to a method of manufacturing a semiconductor device such as a semiconductor laser, a semiconductor photodetector, a semiconductor optical switch, a semiconductor optical filter, and a semiconductor optical modulator. More particularly, it relates to a method of manufacturing a semiconductor optical device in which a semiconductor device can be manufactured by a self-alignment process. The present invention also relates to a gyro that can be prepared by using such a method.

2. Related Background Art

Conventionally, semiconductor optical devices are manufactured by forming a semiconductor layer that provides intended functions, such as light emission, light detection, light guidance and modulation, on a substrate by means of crystal growth, subsequently etching the device to the size and the shape designed to substantiate the intended functions and finally forming electrodes. See, inter alia, Japanese Patent Application Laid-Open No. 5-7019.

However, when the size of electrodes formed is small, known methods of manufacturing semiconductor optical devices are accompanied by the difficulty of alignment in the photolithography processes. For instance, it is extremely difficult to form a 4 µm wide electrode on a 5 µm wide mesa with any known method of manufacturing semiconductor optical devices.

Additionally, known methods of manufacturing semiconductor optical devices involve the step of forming an etching mask such as a photoresist on a semiconductor layer followed by etching the semiconductor layer and removing the etching mask. With such a technique, the semiconductor layer is often contaminated during the process between the application of an etching mask such as a photoresist and the removal thereof, making it difficult to achieve a good ohmic contact when forming an electrode. While a good ohmic contact can be established by using an additional process of etching the semiconductor layer for the purpose of eliminating the contaminated part of the semiconductor layer in the electrode-formed area, the additional process is disadvantageous in terms of increased process steps.

SUMMARY OF THE INVENTION

Therefore, it is an object of the present invention to provide a method of manufacturing a semiconductor optical device that can eliminate the need of aligning a mesa and an electrode to be formed on a mesa.

Another object of the present invention is to provide a gyro comprising a ring-resonator type semiconductor laser in which beams circuitally propagate in opposite directions by using the above manufacturing method.

According to the invention, there is provided a method of manufacturing a semiconductor device comprising the steps of:

preparing a member having at least one semiconductor layer on a substrate;

forming an electrode layer on the semiconductor layer;

forming an etching mask on the electrode layer; and forming a mesa profile by etching the electrode layer and the semiconductor layer.

According to an aspect of the invention, said semiconductor layer has a multilayer structure.

According to another aspect of the invention, said semiconductor layer and said electrode layer each comprising said mesa profile have the same width.

The member is a wafer having at least one semiconductor layer.

According to the invention, there is also provided a method of manufacturing a semiconductor optical device comprising:

a first film forming step of forming at least one semiconductor layer on a substrate;

a second film forming step of forming a film of a first electrode material on said semiconductor layer;

a third film forming step of forming a protection film on said first electrode material;

a step of selectively forming an etching mask;

a first etching step of selectively etching the protection film;

a second etching step of selectively etching the first electrode material;

a third etching step of etching the semiconductor layer to a predetermined depth;

a step of removing the etching mask and the protection film; and a step of forming a second electrode on the substrate.

DESCRIPTION OF THE PREFERRED EMBODIMENTS

Now, the present invention will be described by referring to the accompanying drawings that illustrate preferred embodiments of the invention.

FIGS. 1A through 1E are schematic cross sectional views of a first embodiment of a semiconductor optical device according to the invention.

Figure 1A:
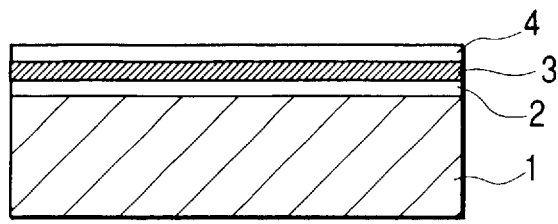
FIGS. 1A, 1B, 1C, 1D and 1E illustrate a process of manufacturing a semiconductor optical device according to a first embodiment of the present invention.

Firstly, referring to FIG. 1A, a semiconductor member having one or more semiconductor layers on a substrate 1 is prepared.

While the semiconductor member of FIG. 1A has three semiconductor layers formed on the substrate 1, it may alternatively have a single semiconductor layer.

When manufacturing a semiconductor laser, reference numeral 3 in FIG. 1A indicates an active layer and reference numerals 2 and 4 indicate low refractive index layers sandwiching the active layer 3.

It may be needless to say that the semiconductor member may have a configuration different from the one illustrated in FIG. 1A so long as it provides desired properties.

Figure 1B:
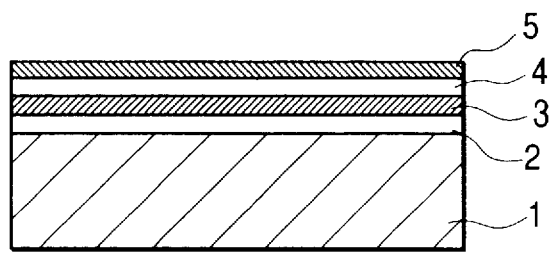

Then, as shown in FIG. 1B, an electrode layer 5 is formed to produce an electrode on mesa.

Figure 1C:
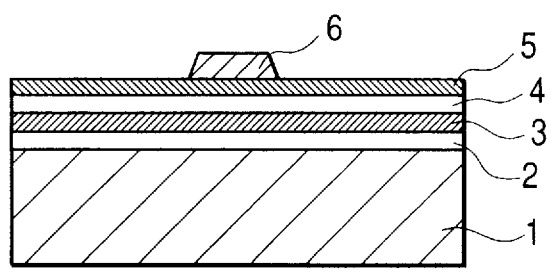

Then, an etching mask 6 is formed as shown in FIG. 1C.

Figure 1D:
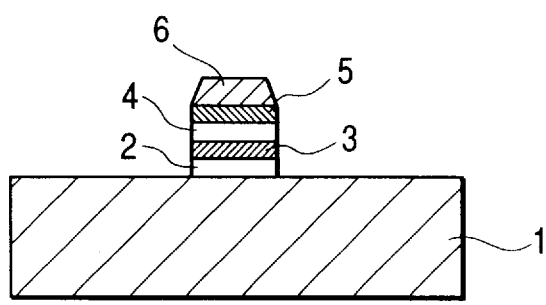

Thereafter, as shown in FIG. 1D, a mesa structure is formed by using the etching mask 6.

Figure 1E:
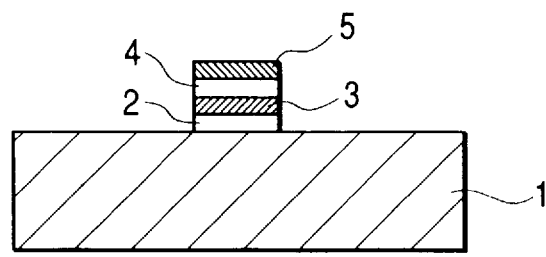

Then, the etching mask 6 is removed (FIG. 1E). Thus, a base member having an electrode consisting of the electrode layer 5 on mesa is obtained.

With the above described process, an electrode consisting of the electrode layer 5 can be prepared on mesa with ease. According to the invention, an electrode can be formed on a micro-device by means of a self-alignment process even when the micro-device has an extremely fine structure.

The electrode on the bottom of the substrate 1 may be formed either after forming a mesa by etching as shown in FIG. 1E or before etching.

It is advantageous to form the electrode-on-mesa before forming the mesa in a manner as described above particularly when the size of a device is small. More specifically, it is particularly advantageous when the size of a device is smaller than about 4 µm. This is because the accuracy of alignment of a photomask is about 2 µm in a photolithography process. If the tolerance of alignment is 2 µm for each side, the size of a device has to be no less than 4 µm with a known manufacturing method. On the other hand, according to the invention, since no alignment of a photomask is required, it is now possible to prepare a device smaller than 4 µm.

Now, a gyro prepared by using a method of manufacturing a semiconductor optical device according to the invention will be discussed below.

Figure 2:
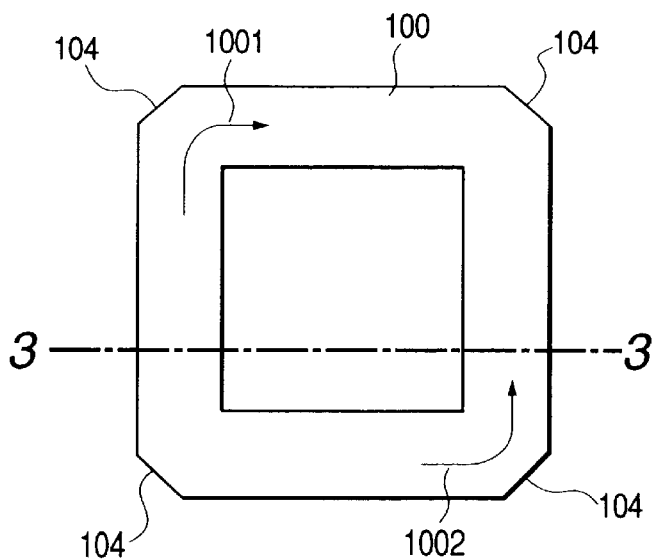
FIG. 2 shows a semiconductor laser which is prepared by a manufacturing method according to the present invention.

Firstly, a semiconductor laser device having the profile of a waveguide 100 is formed as shown in FIG. 2.

Figure 3:
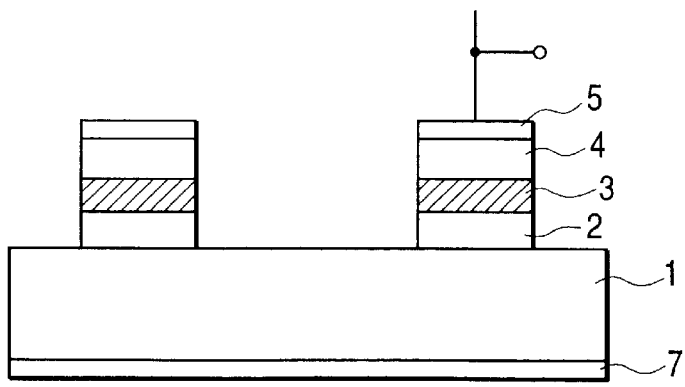
FIG. 3 is a cross sectional view taken along line 3—3 in FIG. 2.

FIG. 3 is a cross sectional view taken along line 3—3 in FIG. 2.

Referring to FIG. 3, there are shown a substrate 1, a pair of cladding layers 2 and 4, an active layer 3 and a pair of electrodes 5 and 7.

An electric current is injected into the device by way of the electrodes and then exceeds a threshold level, thereby causing a laser oscillation.

The device has a waveguide, as shown in FIG. 2, in which a pair of laser beams 1001 and 1002 coexist propagating circuitally in opposite directions. Reference numeral 104 in FIG. 2 denotes a mirror.

Figure 4:
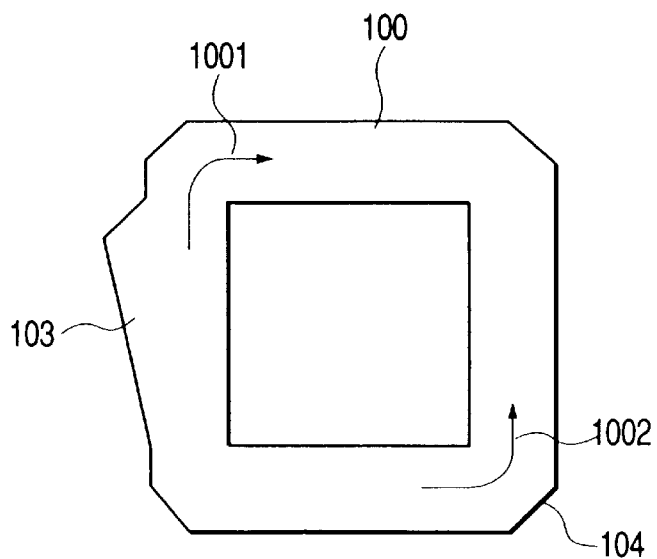
FIG. 4 shows a semiconductor laser device having an asymmetric tapered waveguide.

Assume that the laser device is driven with a constant current. Then, when the laser device is subjected to a rotary motion, the first laser beam 1001 and the second laser beam 1002 show a difference in oscillation frequency to interfere with each other according to the Sagnac effect, thereby generating a beat. Since the beat can be detected as a change in the voltage applied to the laser device, or more accurately, a change in the voltage frequency, the angular velocity of an object can be detected therewith. Japanese Patent Application Laid-Open Nos. 57-43486 (U.S. Pat. No. 4,431,308) and 4-174317 describe techniques for detecting the angular velocity of an object by utilizing such a voltage change. Note that, no beat occurs at a stationary state with the waveguide having a symmetrical profile as shown in FIG. 2. Alternatively, the laser device can be formed such that there is a difference in oscillation frequency between the first laser beam 1001 and the second laser beam 1002 even when it is held stationary, by providing it with a tapered asymmetric profile 103 as shown in FIG. 4. With such an arrangement, not only the angular velocity but also the sense of rotation of an object can be detected by comparing the beat frequency at a stationary state with that in rotation.

While the waveguide may have a tetragonal profile as shown in FIG. 2, it may alternatively have a circular or trigonal or some other polygonal profile. Additionally, the waveguide does not necessarily have a ring profile. The entire lateral surfaces of the waveguide are preferably total reflection planes so that a laser oscillation occurs efficiently.

Now, means for detecting the change in the voltage signal or the like of a laser device will be discussed below.

Figure 31:
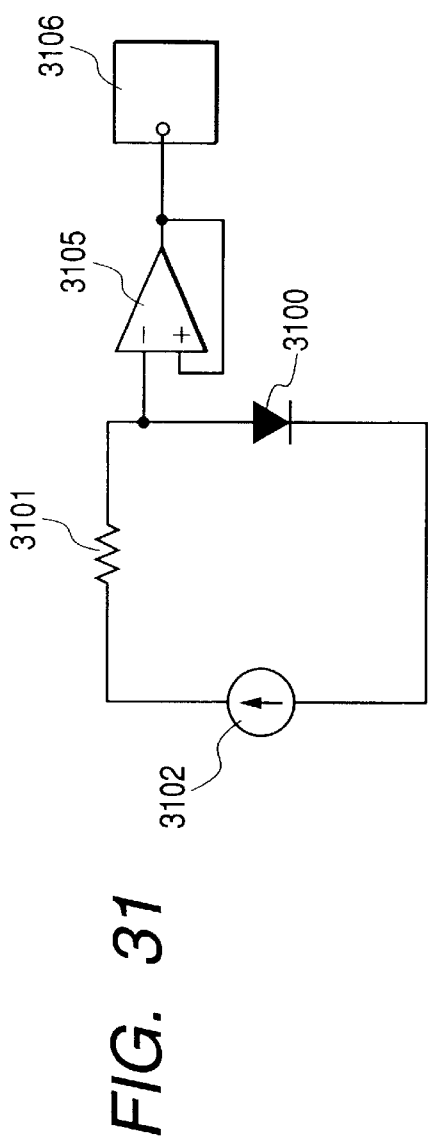
FIG. 31 is a schematic circuit diagram for detecting voltage of a semiconductor laser device.

A constant current source 3102 is brought in and connected to a laser device of a semiconductor laser 3100 by way of a resistor 3101 as shown in FIG. 31. Then, an electric signal (voltage signal in this case) of the semiconductor laser 3100 is detected by means of a voltage detection circuit 3106.

If necessary, a voltage follower circuit 3105 is preferably arranged as a protection circuit in a manner as shown in FIG. 31.

Figure 32:
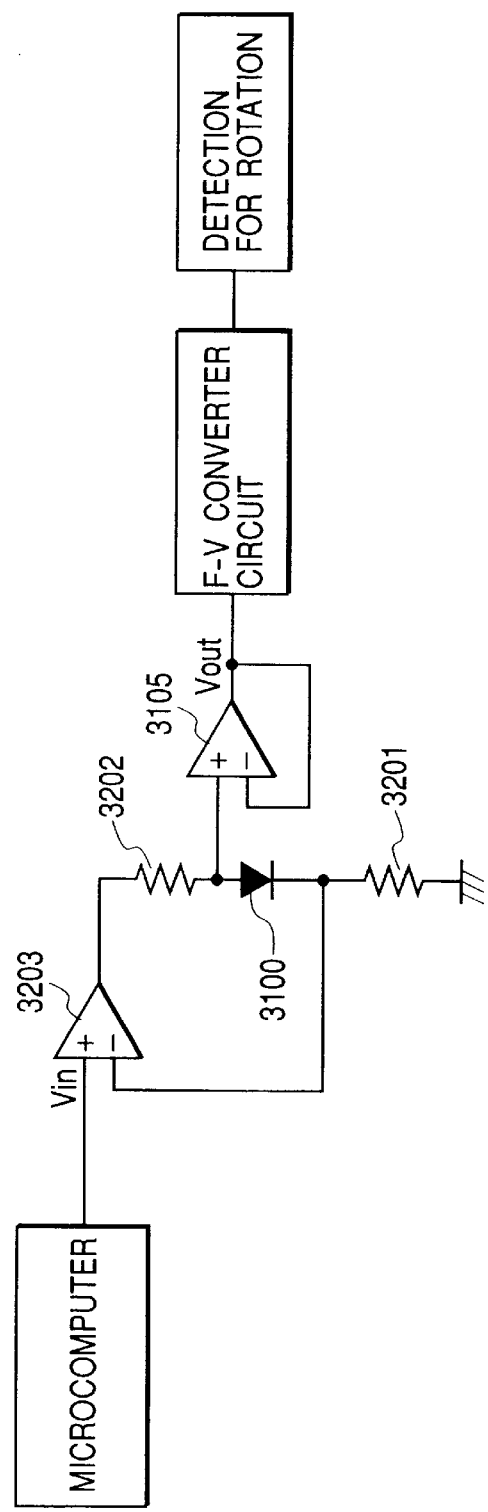
FIG. 32 is a schematic circuit diagram for detection of rotation.

FIG. 32 is a schematic circuit diagram for detection of rotation by driving the laser with a constant current and reading a change in the anode potential thereof.

The anode of the semiconductor laser 3100 is connected to an operational amplifier 3203 by way of a protection resistor 3202, while the cathode of the semiconductor laser 3100 is connected to the inverting input terminal of the operational amplifier 3203.

Then, a voltage follower circuit 3105 outputs a signal Vout in response to the input potential Vin applied typically from a microcomputer. Since the signal Vout contains a beat frequency that is proportional to angular velocity, the rotation of the semiconductor laser can be detected by converting the signal into a voltage typically by means of a known frequency/voltage converter circuit (F/V converter circuit).

Figure 33:
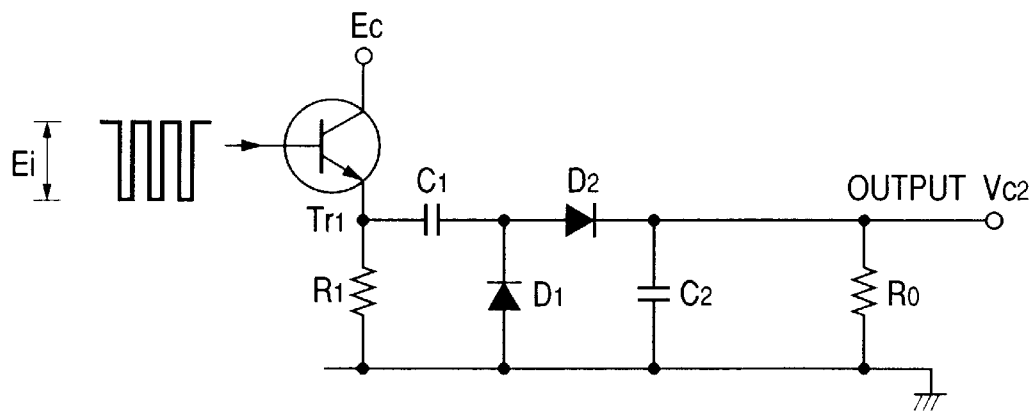
FIG. 33 is a schematic circuit diagram of a frequency/voltage converter circuit.

FIG. 33 is a schematic circuit diagram of a frequency/voltage converter circuit that can be used for the purpose of the invention. The circuit comprises a transistor, diodes, capacitors and resistors in which the output voltage $V_{c2}$ thereof is expressed by the following formula:

$$V_{c2}=E_iC_1R_0f/[1+1/\{1-\exp(-1/R_0C_2f)\}]$$

where $E_i$ represents the peak-to-peak value of the input voltage and f represents the beat frequency. By selecting values satisfying $C_2 \gg C_1$ and $R_0C_2f \ll 1$ for the circuit parameters, $V_{c2}$ is expressed by the equation below, so that a voltage output that is proportional to the beat frequency can be obtained.

$$V_{c2}=E_iC_1R_0f/2$$

Now, the arrangement for detecting the rotation of the laser device through a change in electric current will be discussed below.

Figure 34:
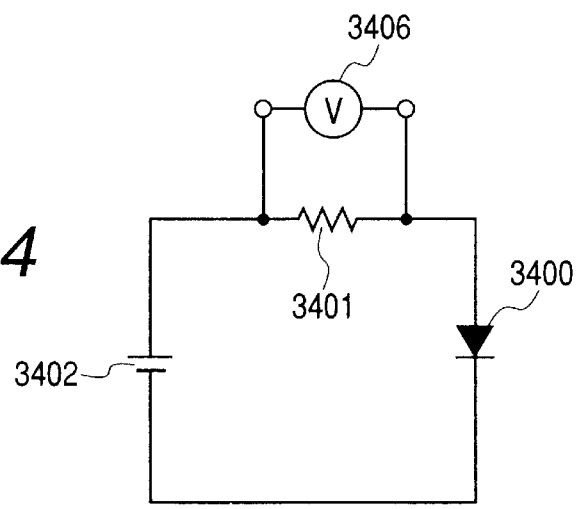
FIG. 34 is a schematic circuit diagram for detecting current of a semiconductor laser device.
Figure 35:
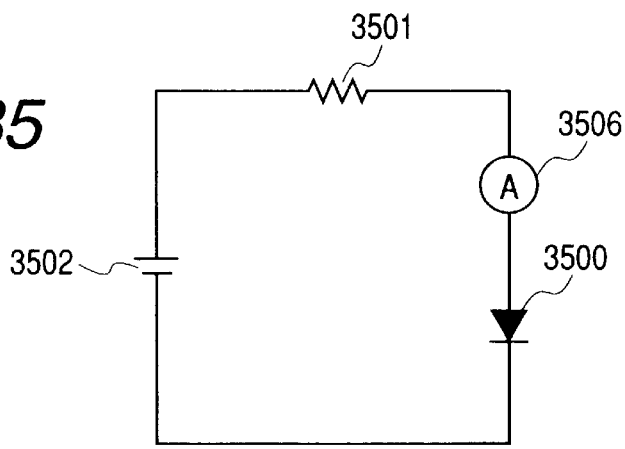
FIG. 35 is a schematic circuit diagram for detecting current of a semiconductor laser device.

The angular velocity of a rotating laser device can be determined by detecting a change in electric current flowing through a semiconductor laser, using a constant voltage source as a power source. A compact and lightweight drive system can be obtained for the laser device by using a battery for the constant voltage source as shown in FIG. 34 or 35. In the circuit of FIG. 34, the semiconductor laser 3400 is connected to a resistor 3401 in series so that the electric current flowing through the semiconductor laser can be determined by observing the change in the voltage between the opposite ends of the electric resistor. In FIG. 34, reference numeral 3402 denotes a battery and reference numeral 3406 denotes a voltmeter. In the circuit of FIG. 35, on the other hand, the semiconductor laser 3500 is connected to an ammeter 3506 in series to directly determine the electric current flowing through the semiconductor laser. In FIG. 35, reference numeral 3501 denotes an electric resistor.

Now, another circuit configuration that can be used for detecting a beat signal for the purpose of the invention will be discussed below.

Figure 36:
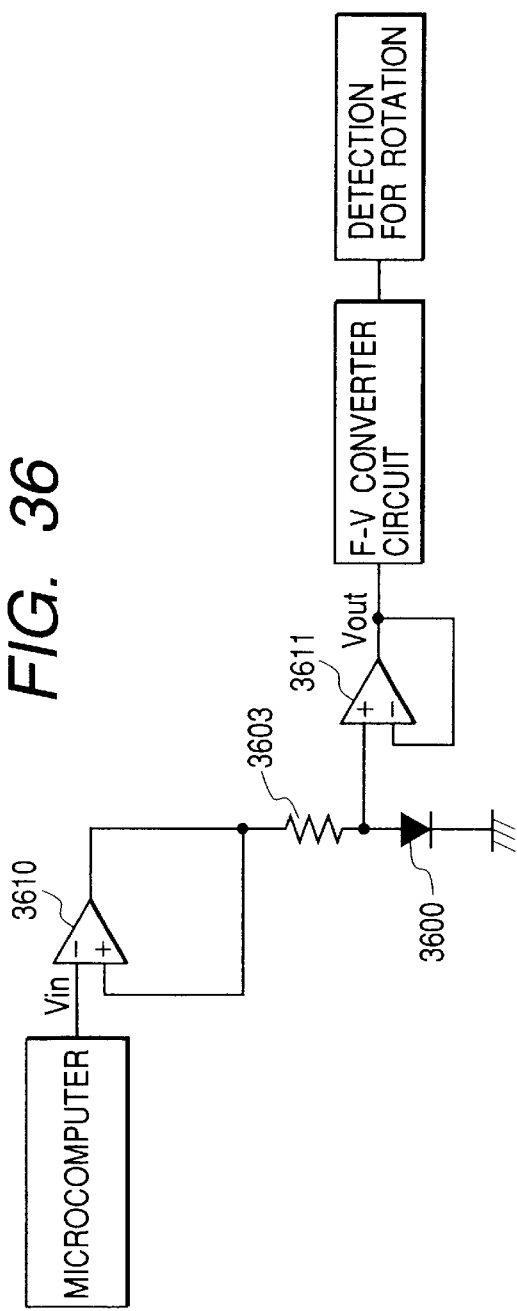
FIG. 36 is a schematic circuit diagram for detection of rotation.

FIG. 36 is a circuit diagram of a circuit for detection of rotation in which a constant voltage is applied to a semiconductor laser 3600 in order to drive it, thereby reading the change in the anode potential thereof to detect the rotation.

The anode of the laser 3600 is connected to the output terminal of an operational amplifier 3610 by way of a resistor 3603 and the cathode of the laser 3600 is grounded at a reference potential.

A constant voltage drive arrangement can be obtained by applying a constant potential (Vin) to the inverting input terminal of the operational amplifier 3610 by means of, for instance, a microcomputer, so that the potential may constantly be applied to the resistor 3603 and the laser 3600.

The electric resistor 3603 is connected to a voltage follower circuit 3611.

The voltage follower circuit 3611 outputs signal Vout, which has a beat frequency that is proportional to angular velocity, so that the rotation of the laser device can be detected by changing the frequency into a voltage by means of a known frequency/voltage converter circuit (F/V converter circuit). It may be needless to say that it is also possible to detect the rotation of the laser device by applying the signal obtained at a point equipotential with the electric resistor 3603 directly to the F/V converter circuit without passing through the voltage follower circuit 3611. A frequency counter circuit may be used as a beat signal detection circuit.

Figure 37:
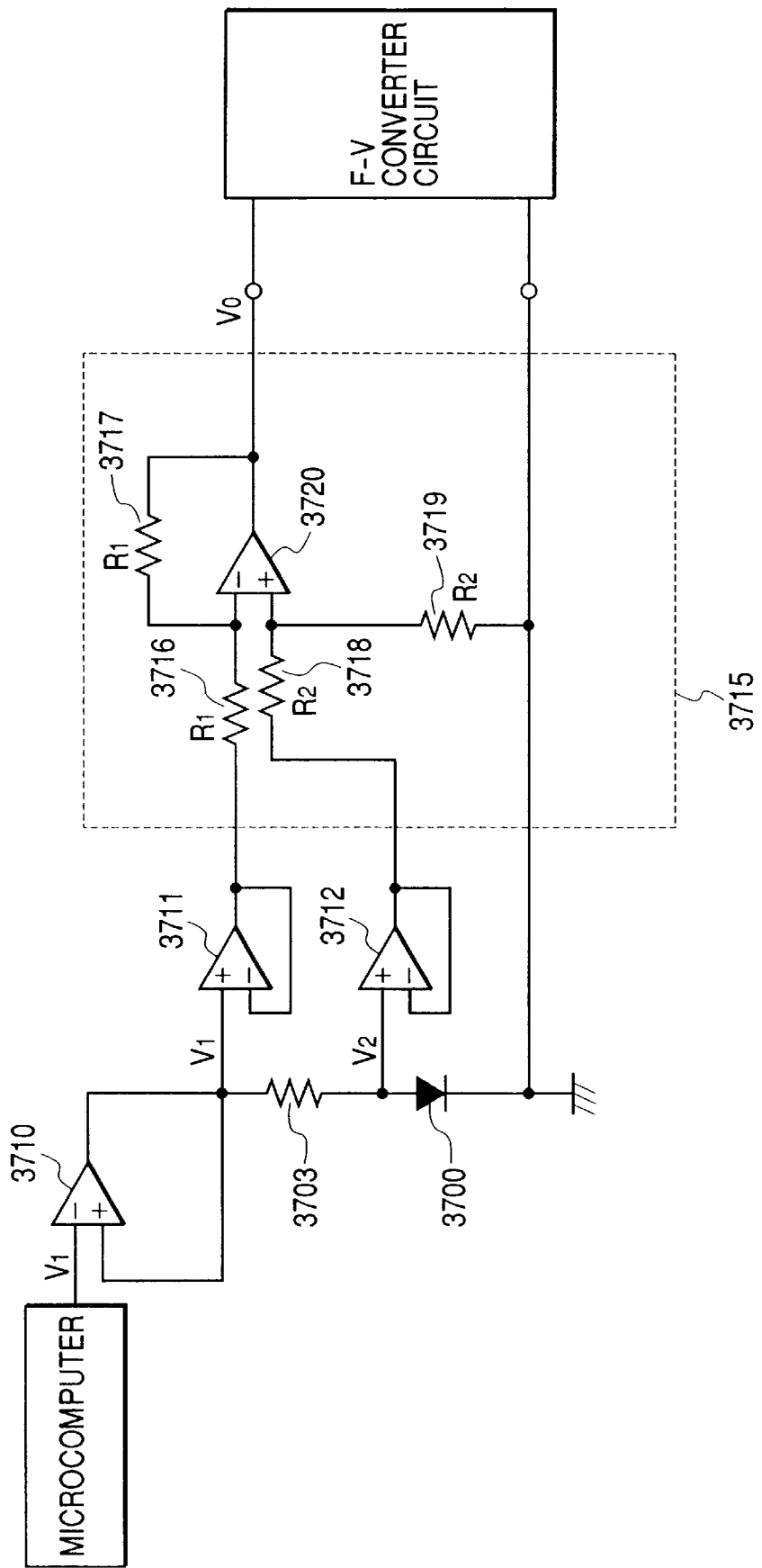
FIG. 37 is a schematic circuit diagram for detection of rotation.

FIG. 37 shows a circuit diagram having a subtraction circuit 3715 as well as the constant voltage drive arrangement as described above by referring to FIG. 36, in which the ground potential is taken as a reference potential for the signal.

Referring to FIG. 37, a constant voltage $V_1$ is applied to the inverting input terminal of an operational amplifier 3710 by means of, for instance, a microcomputer. In FIG. 37, reference numeral 3700 denotes a laser device and reference numerals 3711 and 3712 denote respective voltage followers, while reference numerals 3703 and 3716 through 3719 respectively denote electric resistors. The resistors 3716 and 3717 have the same electric resistance, and likewise resistors 3718 and 3719 have the same electric resistance.

The potentials $V_1$ and $V_2$ at the opposite ends of the electric resistor 3703 are applied respectively to the inverting input terminal and the non-inverting input terminal of an operational amplifier 3720 by way of the voltage followers 3711, 3712 and the resistors 3716 and 3718. With this arrangement, the change in the voltage $V_2-V_1$ (=$V_0$) applied to the resistor 3703 can be detected by using the ground potential as reference potential, indicating that the change in the electric current flowing through the laser device 3700 can be detected.

Then, the rotation of the laser device can be detected by letting the obtained signal pass through an F/V converter circuit.

Figure 38:
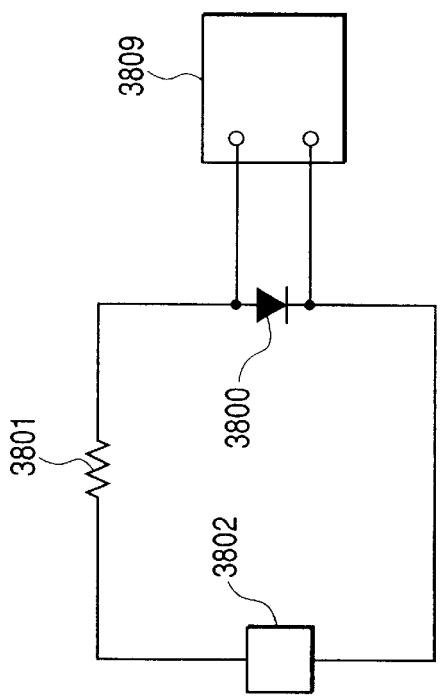
FIG. 38 is a schematic circuit diagram for detecting impedance of a semiconductor laser device.

It is also possible to observe the change in the impedance of a semiconductor laser 3800 directly by means of an impedance meter 3809 as shown in FIG. 38 regardless of the type of the power source. In FIG. 38, reference numerals 3801 and 3802 denote an electric resistor and a power source respectively. With this arrangement, the influence of the noise of the drive power source can be reduced unlike the case where the terminal voltage applied to or the electric current flowing through the laser device is observed.

Now, the present invention will be described by referring to the drawings that illustrate examples.

EXAMPLE 1

Figure 5A:
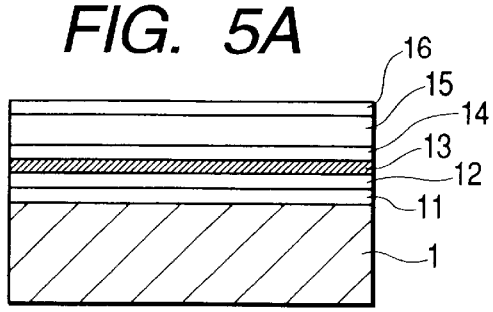
FIGS. 5A, 5B, 5C, 5D, 5E, 5F, 5G and 5H schematically illustrate a process of manufacturing a semiconductor optical device according to the invention in Example 1.

FIGS. 5A through 5H schematically illustrate a process of manufacturing a semiconductor optical device according to the invention in Example 1. Note that this example indicates a method of manufacturing a semiconductor laser as a semiconductor optical device. For manufacturing the semiconductor laser, firstly, a plurality of semiconductor layers are formed on a substrate as shown in FIG. 5A. In FIG. 5A, there are shown a substrate 1, a buffer layer 11, an optical guiding layer 12, an active layer 13, another optical guiding layer 14, a cladding layer 15 and a cap layer 16.

More specifically, in Example 1, an n-InP buffer layer 11 (0.05 μm thick), an undoped InGaAsP optical guiding layer 12 having 1.3 μm composition (0.15 μm thick), an undoped InGaAsP optical guiding layer 13 having 1.55 μm composition (0.1 μm thick), another undoped InGaAsP optical guiding layer 14 having 1.3 μm composition (0.15 μm thick), a p-InP cladding layer 15 (2 μm thick) and a p-InGaAsP cap layer 16 having 1.4 μm composition (0.3 μm thick) were grown on an n-InP substrate 1 (350 μm thick) by means of a metal organic vapor phase epitaxial growth technique as shown in FIG. 5A.

Figure 5E:
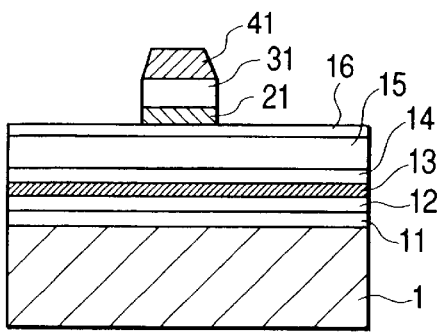
Figure 5B:
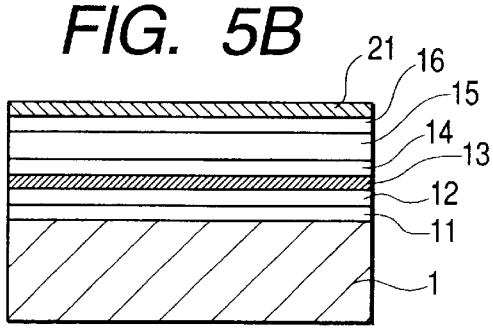
Figure 5F:
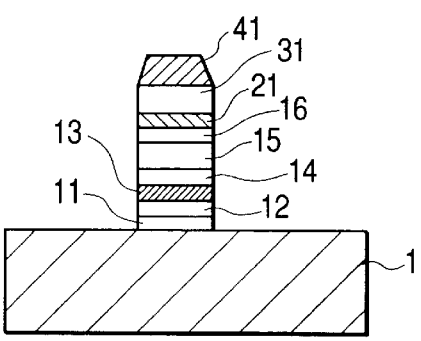
Figure 5C:
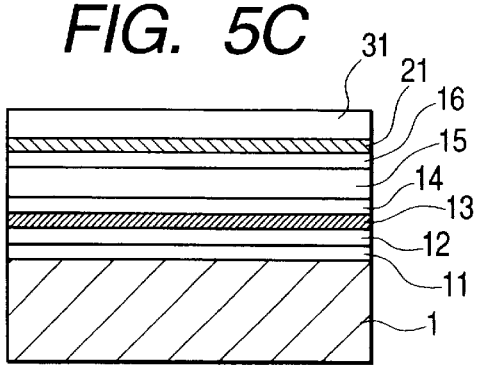
Figure 5G:
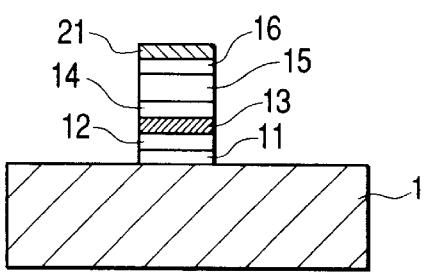
Figure 5D:
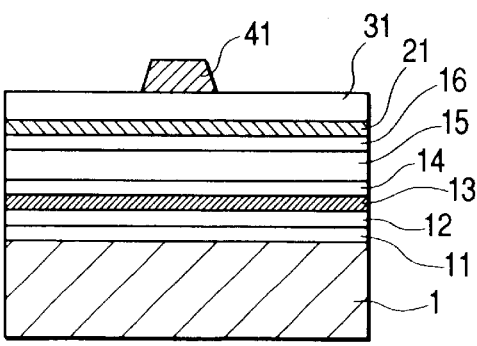

Subsequently, a Cr/Au layer (Cr=5 nm thick, Au=0.15 μm thick) was formed as an anode electrode 21 on the cap layer 16 as shown in FIG. 5B in a vapor deposition system. Then, an SiN layer (0.3 μm thick) was formed as protection film 31 on the anode electrode 21 as shown in FIG. 5C by means of a plasma CVD system. Thereafter, photoresist AZ-1350 (tradename, available from Hoechst) was applied on the protection film (SiN) 31 to a film thickness of 1 μm by means of a spin coater and prebaked at 80° C. for 30 minutes, followed by being exposed to light with a mask (5 μm wide) placed on the wafer, photochemically developed and rinsed to produce an etching mask 41 on part of the protection film 31 as shown in FIG. 5D.

Then, the protection film (SiN) 31 was etched in a reactive ion etching system, using $CF_4$ gas. Subsequently, the Au was etched by switching the gas to Ar gas and then the Cr was also etched by switching back the gas to $CF_4$ gas. As a result of this process, the anode electrode 21 was etched to expose the cap layer 16 except the area covered by the etching mask 41 as shown in FIG. 5E. Then, the wafer was introduced into the reactive ion etching system once again under this condition and etched to a depth of 5 μm by using chlorine gas. FIG. 5F shows the wafer subjected to this etching process. In the area where the etching mask 41 was not formed, all the protection film 31, the anode electrode 21 and the semiconductor layers were etched out.

Figure 5H:
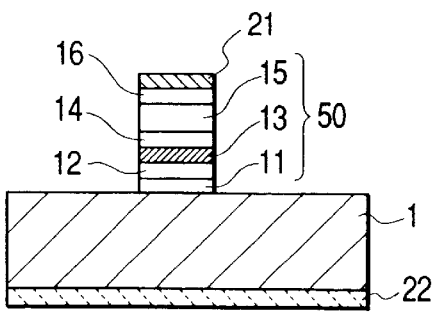

Upon completion of the etching process, the wafer was introduced into a plasma ashing system to remove the etching mask 41 by using oxygen plasma. Then, the protection film 31 was removed by means of wet etching, using buffered hydrofluoric acid. In this way, the anode electrode 21 was shaped to the same size as that of the mesa top as shown in FIG. 5G. Finally, a layer of AuGe/Ni/Au was formed as a cathode 22 on the bottom surface of the n-InP substrate 1 as shown in FIG. 5H by deposition followed by annealing in a hydrogen atmosphere to take an ohmic contact, thereby producing a finished semiconductor laser. Both the contact resistance of the anode and that of the cathode were held below 0.5Ω, indicating that an excellent ohmic contact was achieved.

As described above, the semiconductor layers were formed by means of a crystal growth technique in Example 1 so that the thicknesses and the compositions of the semiconductor layers could be controlled highly precisely.

Additionally, in Example 1, it was also possible to produce a layered structure by means of a diffusion technique or an ion implantation technique. Since it was no longer necessary in this example to form an electrode-on-mesa after forming a mesa 50 unlike known conventional manufacturing methods, the surface of the semiconductor layers was left uncontaminated during the process between the application of photoresist and the removal of the applied photoresist, so that an excellent ohmic contact could be achieved between the cap layer 16 and the electrode 21.

Still additionally, in Example 1, since the protection film 31 was formed on the anode electrode 21, the surface of the electrode could be protected satisfactorily when etching the semiconductor layers even if the etching selectivity of the semiconductor layers relative to the mask (e.g. photoresist) 41 was low.

It may be needless to say that the protection film 31 is not required if a high etching selectivity is secured.

The protection film 31 strongly withstands a dry etching process if it is made of a dielectric or insulating material such as $SiO_2$ or SiN. As will be described hereinafter by referring to the subsequent examples, if the etching selectivity of the semiconductor layers relative to the etching mask 41 is low, it is possible to completely remove the etching mask 41 to expose the protection film 31 by utilizing this characteristic when etching the semiconductor layers. If such is the case, it is no longer necessary to remove the etching mask after the etching operation so that the manufacturing process can be remarkably simplified.

In this example, the protection film 31, the anode electrode 21 and the semiconductor layers were sequentially etched in the area devoid of the etching mask 41 that was made of photoresist or the like. Thus, the top surface of the mesa and that of the electrode substantially have the same size after the etching. Additionally, since the mask did not need to be aligned after forming the electrode on the mesa, the manufacturing method using a self-alignment process can be realized.

The electrode could easily be formed on the mesa if the top area of the mesa on which the electrode was formed was very small. Thus, according to the invention, there is provided a method of manufacturing a semiconductor optical device with an enhanced positional accuracy and a reduced number of manufacturing steps.

EXAMPLE 2

Figure 6A:
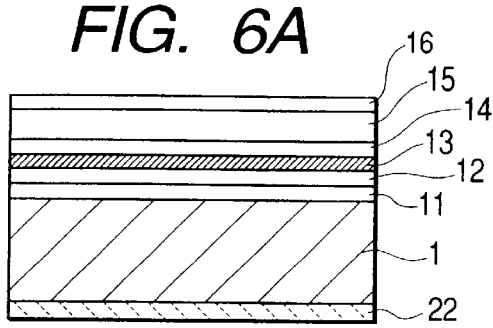
FIGS. 6A, 6B, 6C, 6D, 6E, 6F, 6G and 6H schematically illustrate a process of manufacturing a semiconductor optical device according to the invention in Example 2.
Figure 6B:
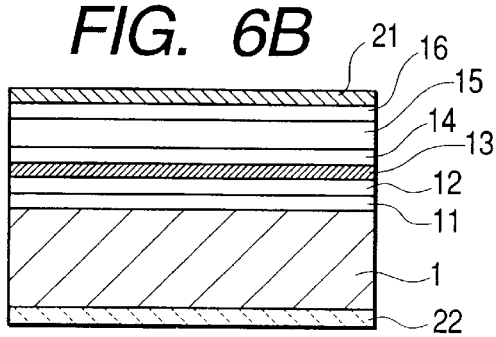
Figure 6C:
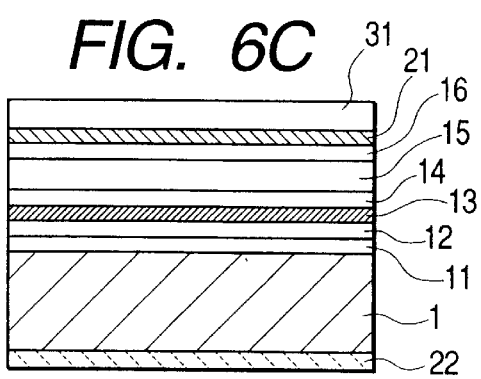
Figure 6D:
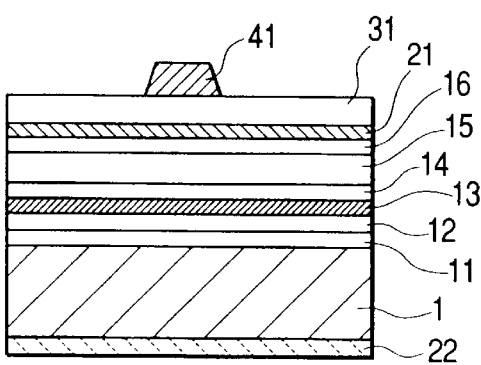
Figure 6E:
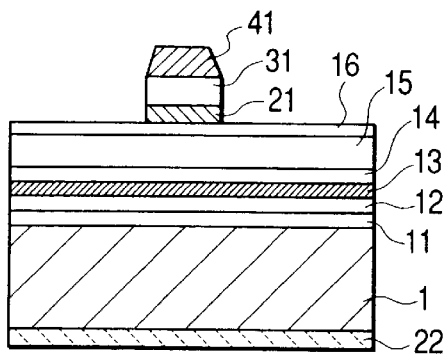
Figure 6F:
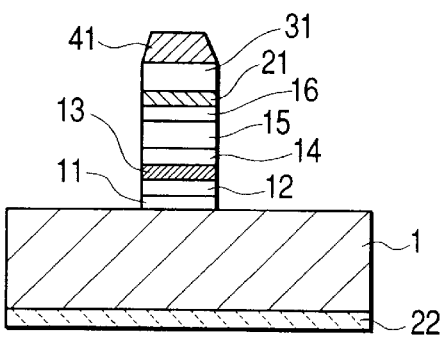
Figure 6G:
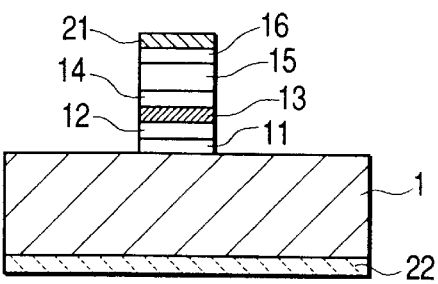
Figure 6H:
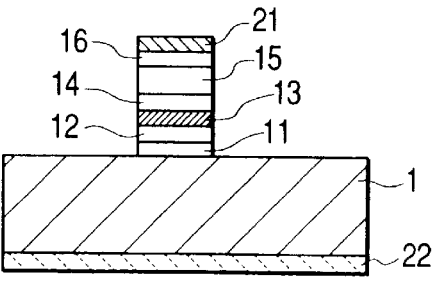

FIGS. 6A through 6H schematically illustrate a process of manufacturing a semiconductor optical device according to the invention in Example 2. This second example differs from the above described first example in that a cathode 22 was formed firstly on a substrate 1 as shown in FIG. 6A. The other process steps as shown in FIGS. 6B through 6H were the same as in Example 1. The contact resistance of the anode 21 and that of the cathode 22 in this example were equivalent to those in the first example. In other words, a cathode may be firstly formed on a substrate 1.

EXAMPLE 3

Figure 7A:
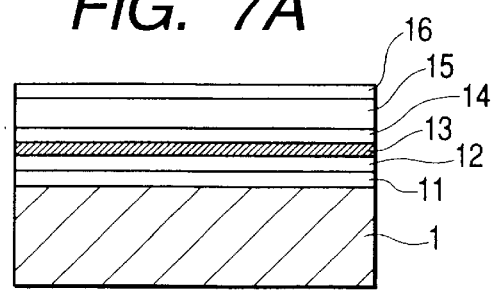
FIGS. 7A, 7B, 7C, 7D, 7E, 7F, 7G and 7H schematically illustrate a process of manufacturing a semiconductor optical device according to the invention in Example 3.
Figure 7E:
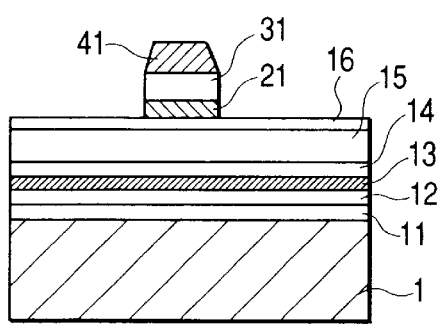
Figure 7B:
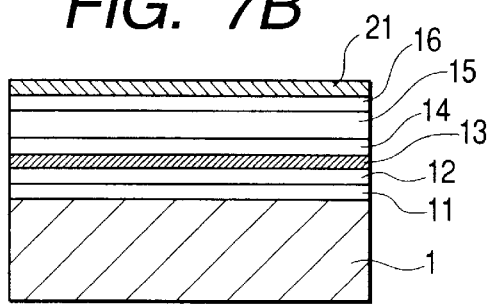
Figure 7F:
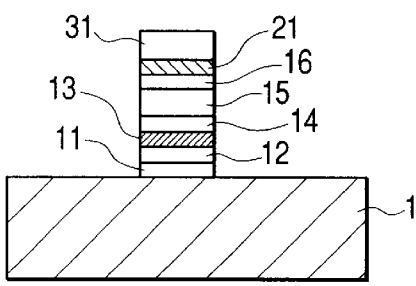
Figure 7C:
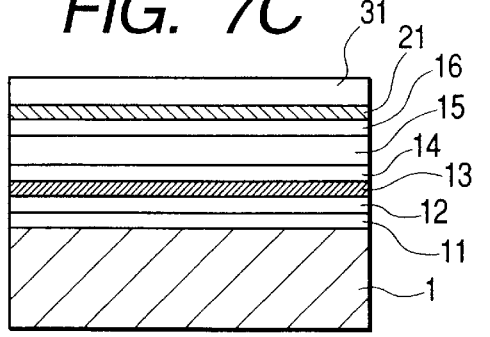
Figure 7G:
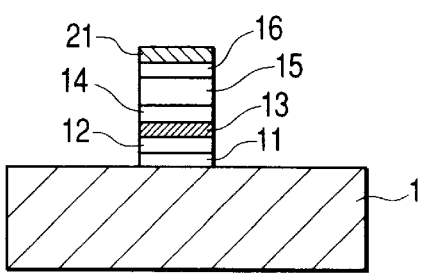
Figure 7D:
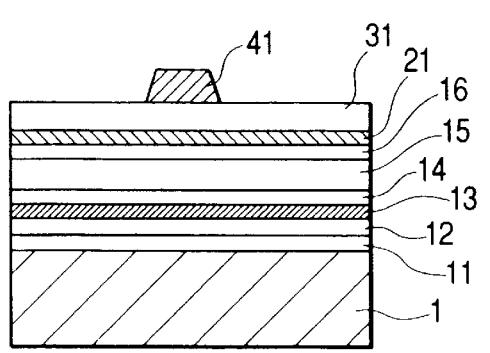
Figure 7H:
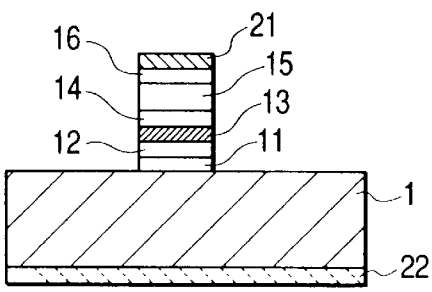

FIGS. 7A through 7H schematically illustrate a process of manufacturing a semiconductor optical device according to the invention in Example 3. This third example differs from the above described first example in that a low etching selectivity of the semiconductor layers relative to the etching mask 41 was taken in order to completely remove the etching mask 41 and expose the protection film 31 as shown in FIG. 7F. For instance, a low etching selectivity can be obtained by using a high acceleration voltage in the process of reactive ion beam etching. Otherwise, this example is identical with the first example as seen from FIGS. 7A through 7E, 7G and 7H. This example is more simplified than the first example because the step of removing the etching mask 41 after etching the semiconductor layers can be eliminated. The contact resistance of the anode 21 and that of the cathode 22 obtained in this example were similar to those of the first example.

EXAMPLE 4

Figure 8A:
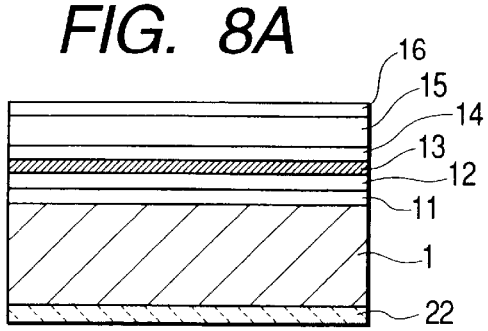
FIGS. 8A, 8B, 8C, 8D, 8E, 8F, 8G and 8H schematically illustrate a process of manufacturing a semiconductor optical device according to the invention in Example 4.
Figure 8B:
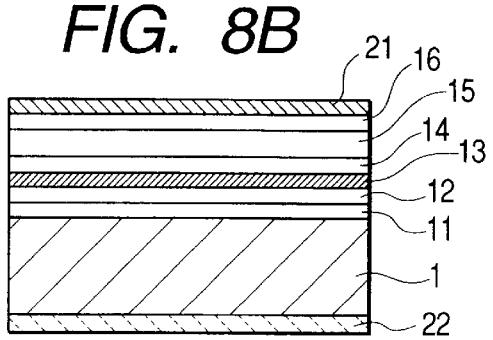
Figure 8C:
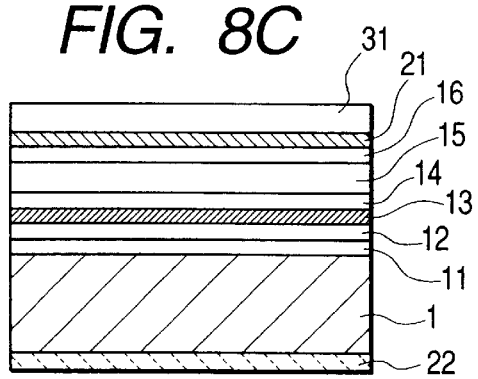
Figure 8D:
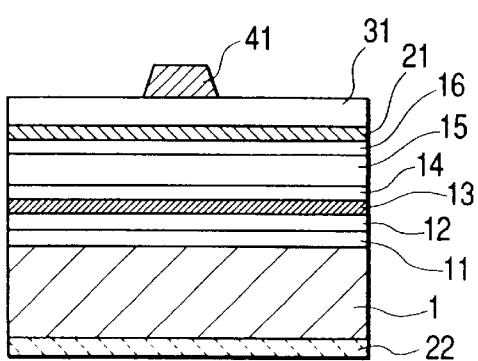
Figure 8E:
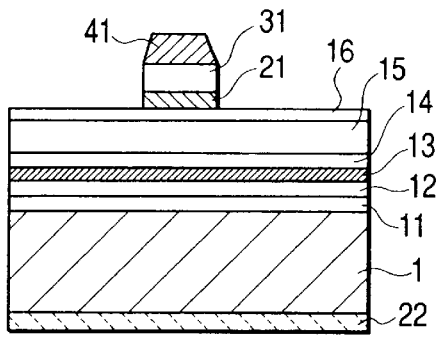
Figure 8F:
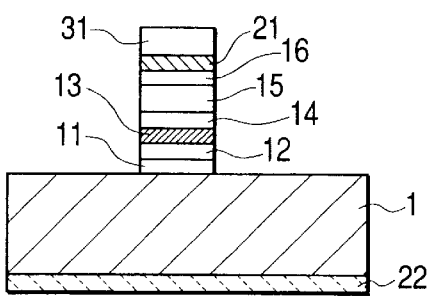
Figure 8G:
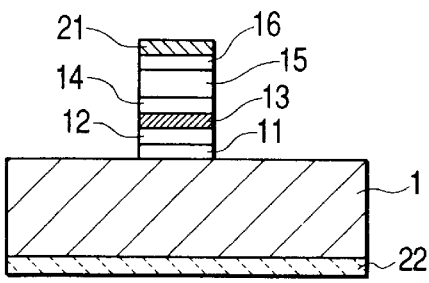
Figure 8H:
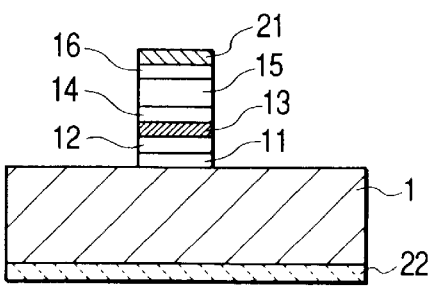

FIGS. 8A through 8H schematically illustrate a process of manufacturing a semiconductor optical device according to the invention in Example 4. This fourth example differs from the above described third example in that a cathode 22 was firstly formed on a substrate 1 as shown in FIG. 8A. Otherwise, this example is identical with the third example as seen from FIGS. 8B through 8H. The contact resistance of the anode 21 and that of the cathode 22 obtained in this example were similar to those of the first example.

EXAMPLE 5

Figure 9A:
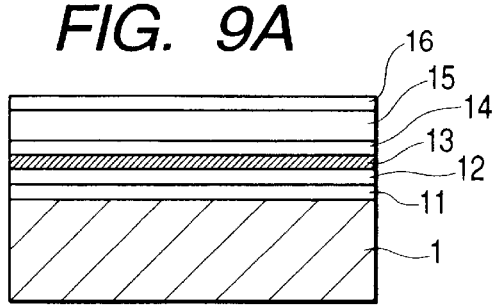
FIGS. 9A, 9B, 9C, 9D, 9E, 9F, 9G and 9H schematically illustrate a process of manufacturing a semiconductor optical device according to the invention in Example 5.
Figure 9E:
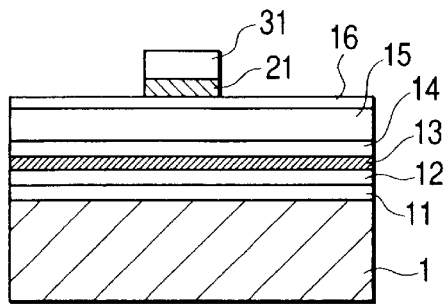
Figure 9B:
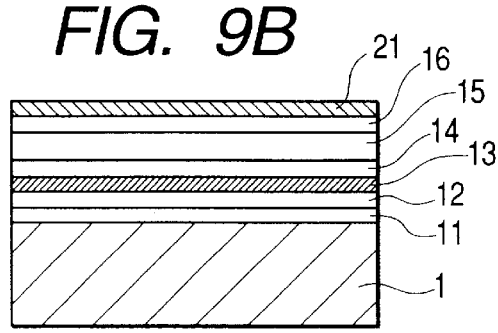
Figure 9F:
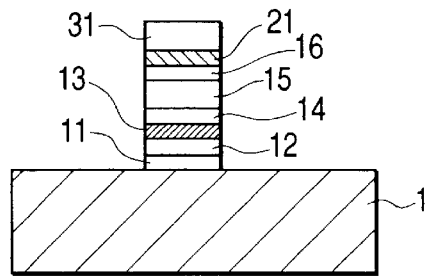
Figure 9C:
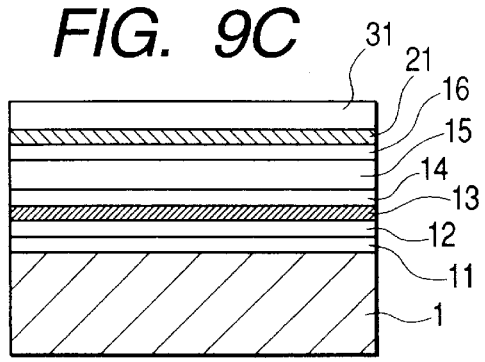
Figure 9G:
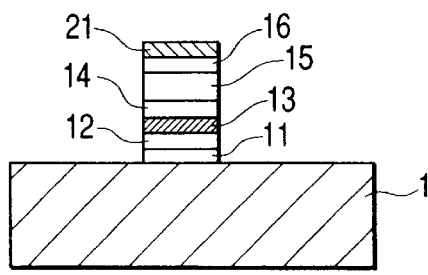
Figure 9D:
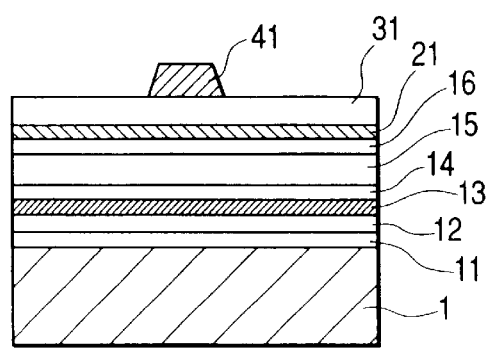
Figure 9H:
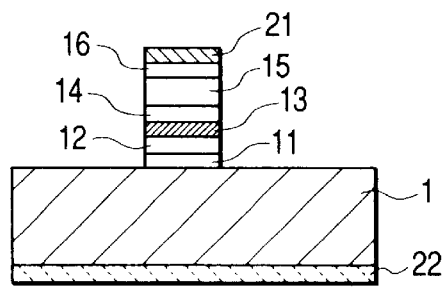

FIGS. 9A through 9H schematically illustrate a process of manufacturing a semiconductor optical device according to the invention in Example 5. This fifth example differs from the above described first example in that a low etching selectivity of the protection film 31 or the anode 21 relative to the etching mask 41 was taken in order to completely remove the etching mask 41 and expose the protection film 31 as shown in FIG. 9E. For instance, a low etching selectivity of the protection film 31 or the anode 21 relative to the etching mask 41 can be obtained by using a high acceleration voltage in the process of reactive ion beam etching.

Otherwise, this example is identical with the first example as seen from FIGS. 9A through 9D and 9F through 9H. This example is more simplified than the first example because the step of removing the etching mask 41 after etching the semiconductor layers can be eliminated. The contact resistance of the anode 21 and that of the cathode 22 obtained in this example were similar to those of the first example.

EXAMPLE 6

Figure 10A:
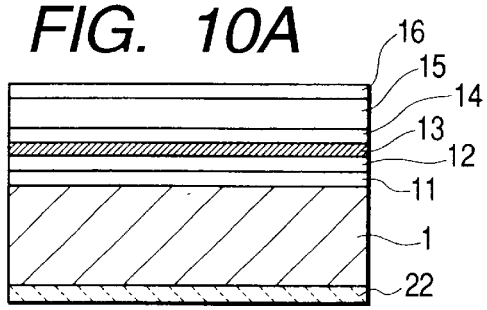
FIGS. 10A, 10B, 10C, 10D, 10E, 10F, 10G and 10H schematically illustrate a process of manufacturing a semiconductor optical device according to the invention in Example 6.
Figure 10B:
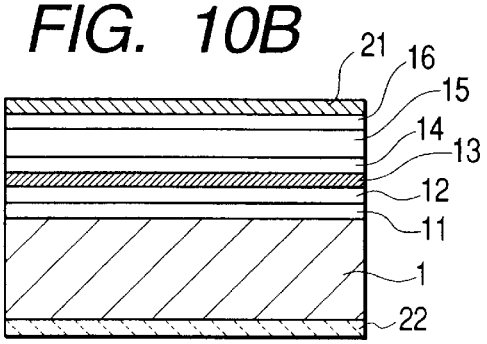
Figure 10C:
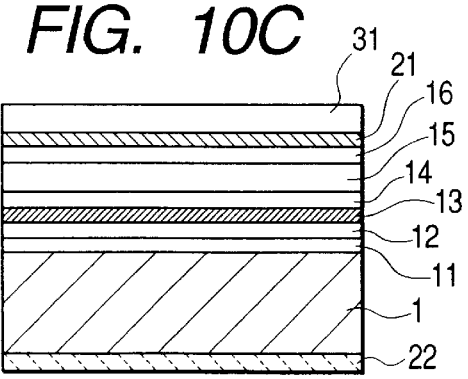
Figure 10D:
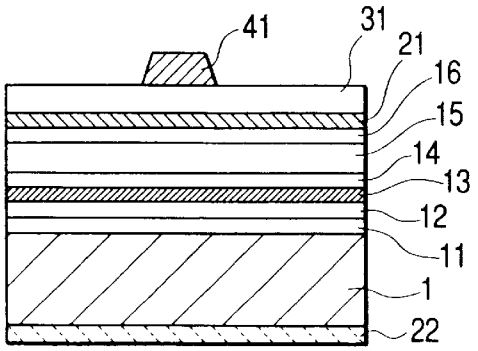
Figure 10E:
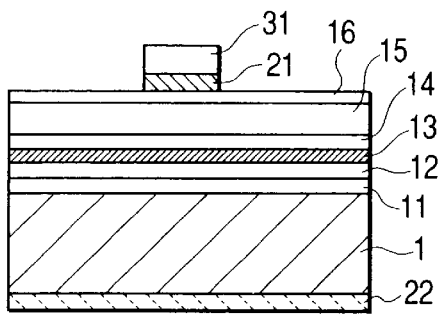
Figure 10F:
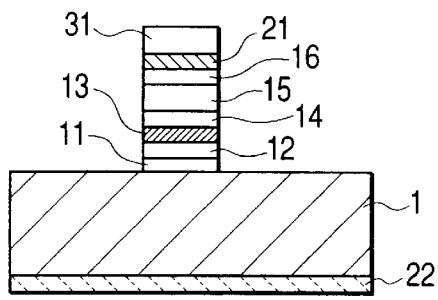
Figure 10G:
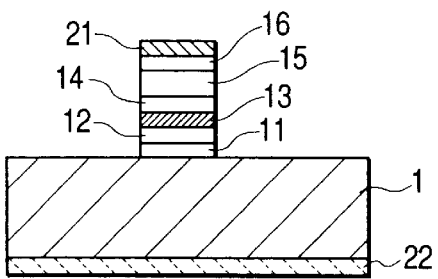
Figure 10H:
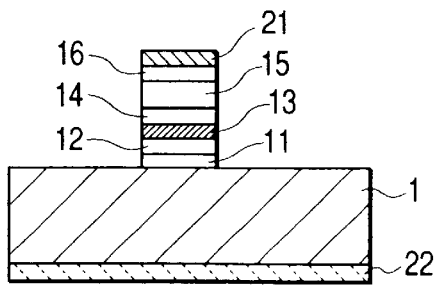
Figure 11A:
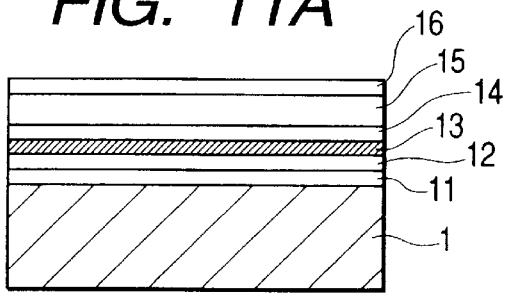
FIGS. 11A, 11B, 11C, 11D, 11E, 11F and 11G schematically illustrate a process of manufacturing a semiconductor optical device according to the invention in Example 7.
Figure 11B:
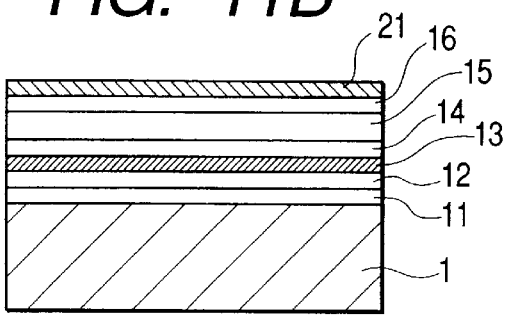
Figure 11C:
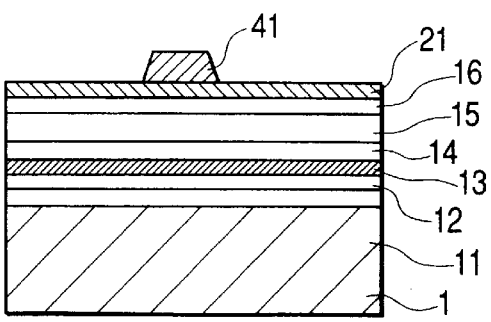
Figure 11D:
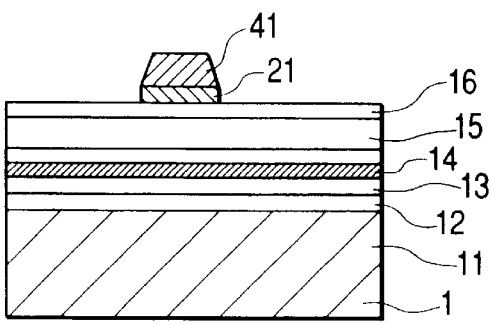
Figure 11E:
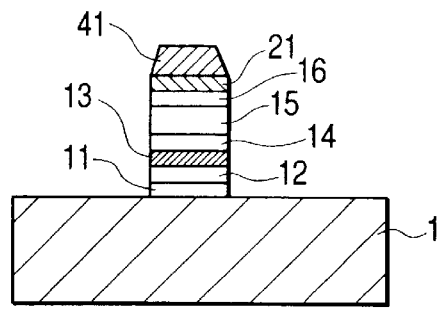
Figure 11F:
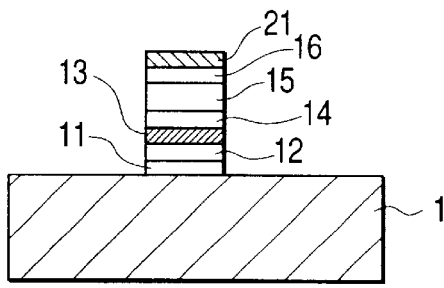
Figure 11G:
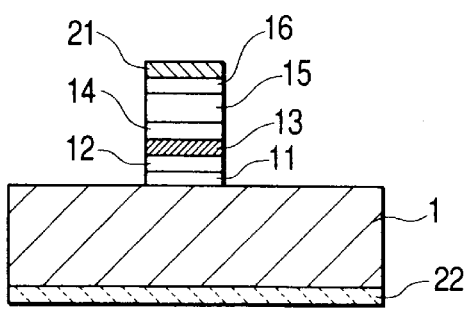

FIGS. 10A through 10H schematically illustrate a process of manufacturing a semiconductor optical device according to the invention in Example 6. This sixth example differs from the above described fifth example in that a cathode 22 was firstly formed on a substrate 1 as shown in FIG. 10A. Otherwise, this example is identical with the fifth example as seen from FIGS. 10B through 10H. The contact resistance of the anode 21 and that of the cathode 22 obtained in this example were similar to those of the first example.

EXAMPLE 7

FIGS. 11A through 11G schematically illustrate a process of manufacturing a semiconductor optical device according to the invention in Example 7. This seventh example differs from the above described first example in that an etching mask was directly formed on the anode 21 as seen from FIG. 11C. More specifically, it was not necessary to use a protection film in this example because a high etching selectivity of the anode 21 and the semiconductor layers relative to the etching mask 41 was taken. Otherwise, this example is identical with the first example as seen from FIGS. 11A, 11B and 11E through 11G. This example is by far more simplified than the first example because the step of forming the protection film and the subsequent steps of etching and removing it can be eliminated. The contact resistance of the anode 21 and that of the cathode 22 obtained with this example were similar to those of the first example.

EXAMPLE 8

Figure 12A:
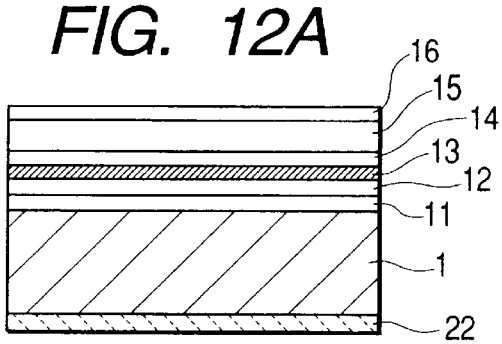
FIGS. 12A, 12B, 12C, 12D, 12E, 12F and 12G schematically illustrate a process of manufacturing a semiconductor optical device according to the invention in Example 8.
Figure 12B:
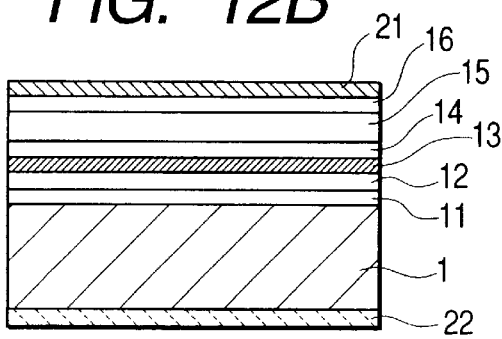
Figure 12C:
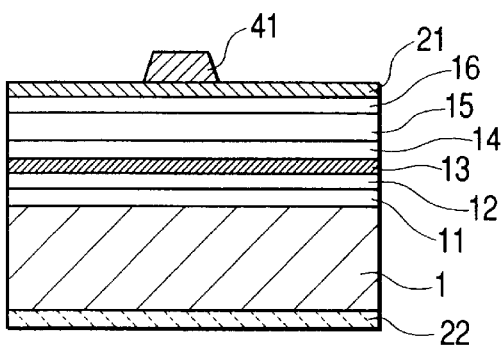
Figure 12D:
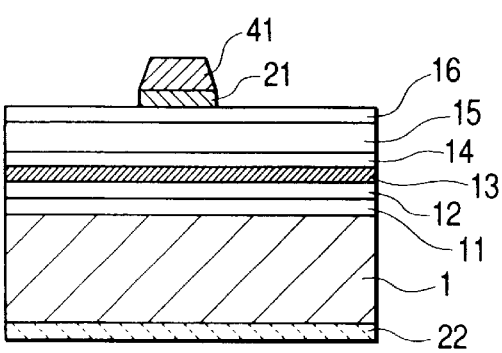
Figure 12E:
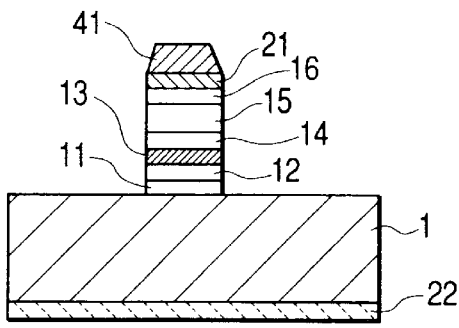
Figure 12F:
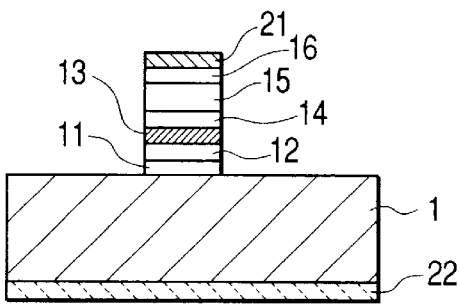
Figure 12G:
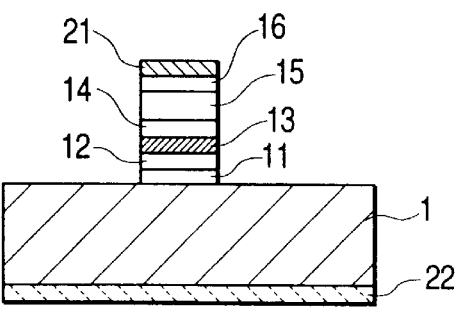

FIGS. 12A through 12G schematically illustrate a process of manufacturing a semiconductor optical device according to the invention in Example 8. This eighth example differs from the above described seventh example in that a cathode 22 was firstly formed on a substrate 1 as shown in FIG. 12A. Otherwise, this example is identical with the seventh example as seen from FIGS. 12B through 12G. The contact resistance of the anode 21 and that of the cathode 22 obtained with this example were similar to those of the first example.

Incidentally, a semiconductor laser was prepared as a semiconductor optical device in each of the above examples, it may be needless to say that the present invention can be used for manufacturing a light emitting device such as a light emitting diode and a super-luminescent diode, a light detection device such as a photodiode and an avalanche-photodiode, an optical filter, an optical switch or an optical modulator. Additionally, while semiconductor materials of the InGaAs type were used in the above examples, materials of the GaAs type, the ZnSe type, the InGaN type, the AlGaN type or some other type may alternatively be used for the purpose of the present invention. Still additionally, the materials used for the anode, the cathode and the protection film may be replaced by appropriate ones so long as they are as effective as those described above. Finally, the active layer is not limited to a bulk structure and may alternatively has a single quantum well structure or a multi-quantum well structure.

Now, an optical gyro provided with a ring-resonator type semiconductor laser that is prepared by a method of manufacturing a semiconductor optical device according to the invention will be described below also by way of examples.

EXAMPLE 9

FIGS. 13 through 21 schematically illustrate a process of manufacturing an optical gyro provided with a ring-resonator type semiconductor laser according to the invention.

Figure 13:
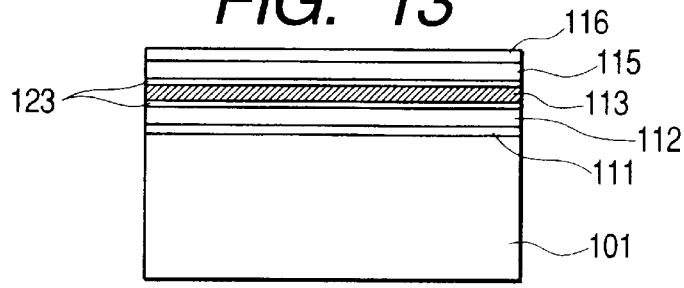
FIGS. 13, 14, 15, 16, 17, 18, 19 and 20 schematically illustrate a process of manufacturing an optical gyro provided with a ring resonator type semiconductor laser according to the invention.

Referring to FIGS. 13 through 21, firstly a substrate having a multilayer structure was brought in. The multilayer substrate includes an active layer 113 having a multi quantum well structure of three layers of $Al_{0.3}Ga_{0.7}As/GaAs$ formed on an n-GaAs substrate 101 with a pair of optical guiding layers 123 of $Al_{0.3}Ga_{0.7}As$ sandwiching the active layer, which were further sandwiched by a cladding layer 115 of $p-Al_{0.5}Ga_{0.5}As$ and another cladding layer 112 of $n-Al_{0.5}Ga_{0.5}As$ (FIG. 13). Reference numeral 111 in FIG. 13 denotes a buffer layer of n-GaAs formed on the substrate 101 and reference numeral 116 denotes a cap layer made of p-GaAs formed on the upper cladding layer 115.

Figure 14:
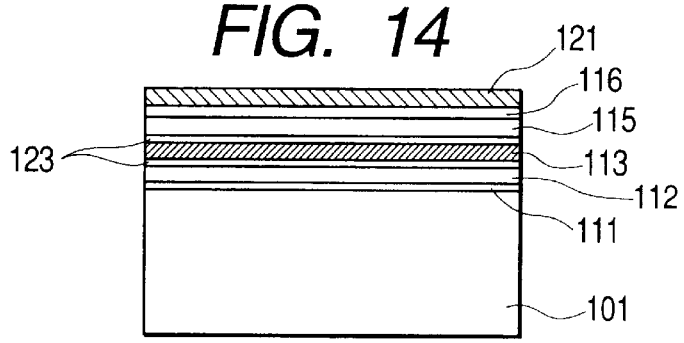
Figure 15:
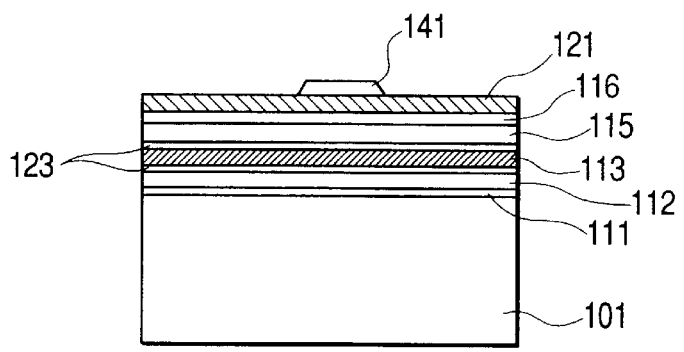
Figure 16:
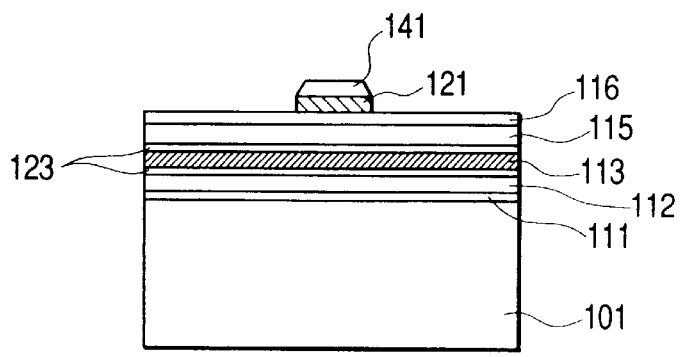
Figure 17:
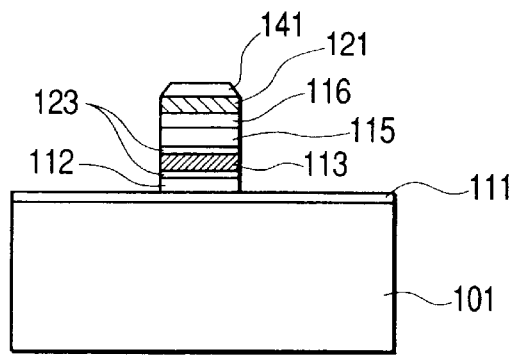

Then, Cr/Au (or Ti/Pt/Au) was formed on the cap layer 116 as an anode 121 (FIG. 14). Thereafter, a photoresist 141 was coated thereon and a patterning operation was conducted as shown in FIG. 15. Then, the anode 121 was subjected to a dry etching operation by using the patterned photoresist 141 as a mask (FIG. 16).

Figure 18:
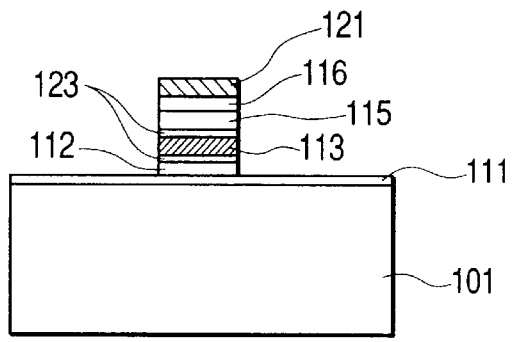

Subsequently, the semiconductor layers were removed by dry-etching (FIG. 17) and the photoresist 141 was removed (FIG. 18). While the buffer layer 111 was left in FIG. 17, it may alternatively be also etched out. After removing the photoresist layer, annealing in a hydrogen atmosphere was carried out to turn it into an alloy.

Figure 19:
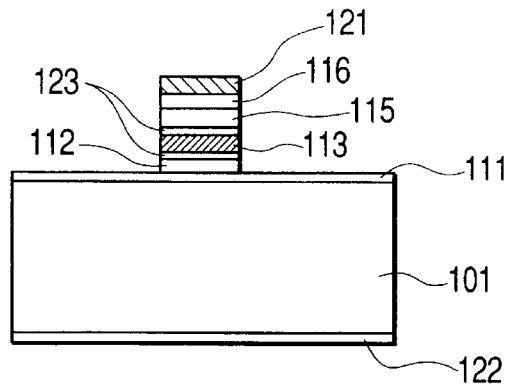
Figure 20:
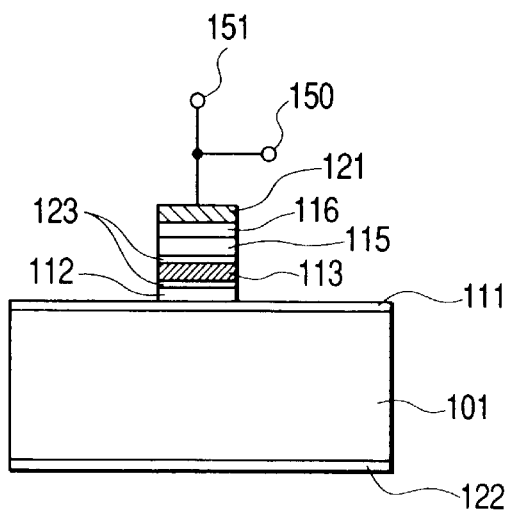

After polishing the substrate, a cathode 122 was formed by depositing AuGeNi/Au as needed (FIG. 19). Then, annealing in a hydrogen atmosphere was again carried out to turn it into an alloy. Thereafter, a terminal 150 was arranged to detect beat signal generated in the semiconductor laser in the form of a change in the electric current, the voltage or the impedance (FIG. 20). The beat signal output from the terminal 150 was detected in the form of a change in the electric current, the voltage or the impedance by means of a detection circuit (not shown).

Figure 21:
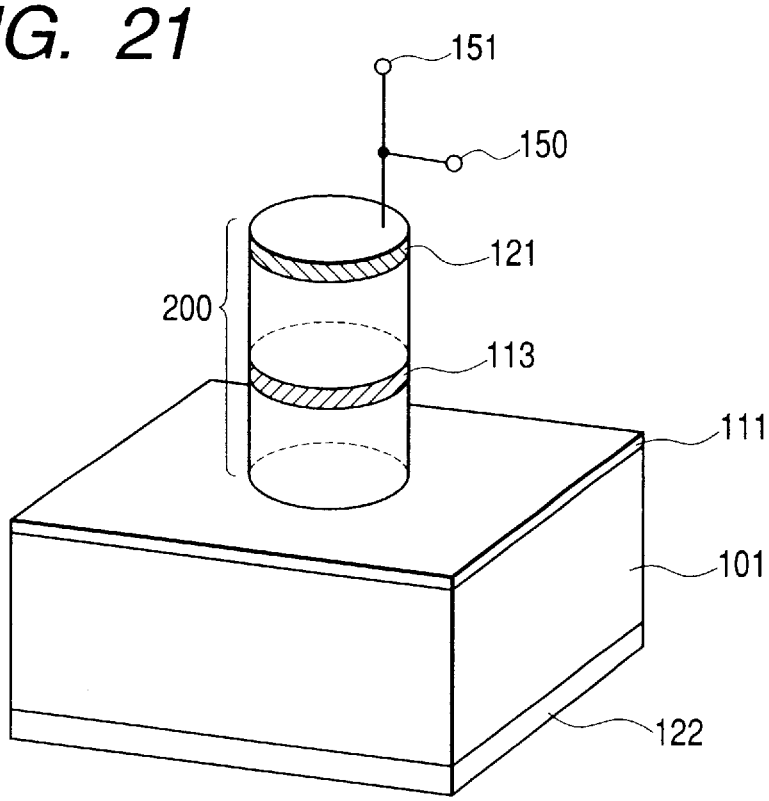
FIG. 21 shows an optical gyro having a ring resonator type semiconductor laser according to the invention.

Thus, an optical gyro having a ring resonator type semiconductor laser 200 as shown in FIG. 21 was formed. Note that FIG. 21 shows only the active layer 113 and the cladding layers sandwiching it and so on are omitted from FIG. 21. Reference numeral 151 in FIG. 21 denotes a wire extended from the anode and used for current injection and so on.

In a ring-resonator type semiconductor laser having a configuration as shown in FIG. 21, laser beams propagate circuitally in opposite directions. When the laser rotates, the two beams of the semiconductor laser interfere with each other to change the oscillation frequency, thereby generating a beat due to the Sagnac effect. A change in the beat can be detected in the form of the electric current, the voltage or the impedance, thereby providing an optical gyro for detecting the angular velocity of an object.

When an electric current is injected into a semiconductor laser having the above described configuration by way of the anode 121, reflection occurs at the interface of the semiconductor and the ambient air because they have respective refractive indexes that are different from each other. If the refractive index of the semiconductor is 3.5, a total reflection occurs when the angle between the normal of the interface and the laser beam is 16.6 degrees or more.

The oscillation mode that produces a total reflection has an oscillation threshold gain smaller than that of any other oscillation mode due to the absence of mirror loss so that oscillation begins at a low current injection level.

Additionally, the gain concentrates on this oscillation mode to effectively suppress oscillation in any other mode. In a device comprising a semiconductor laser 200 and having a radius of 10 μm, the oscillation threshold current was 0.8 mA when the active layer was 0.1 μm thick. When being subjected to a rotation of 30 degrees per second, which was equivalent to a camera shake or vibrations of an automobile, with a drive current of 3 mA, a signal with a voltage having an amplitude of 100 mV and a frequency of 43.0 Hz was obtained from the electrode terminals.

EXAMPLE 10

Figure 22:
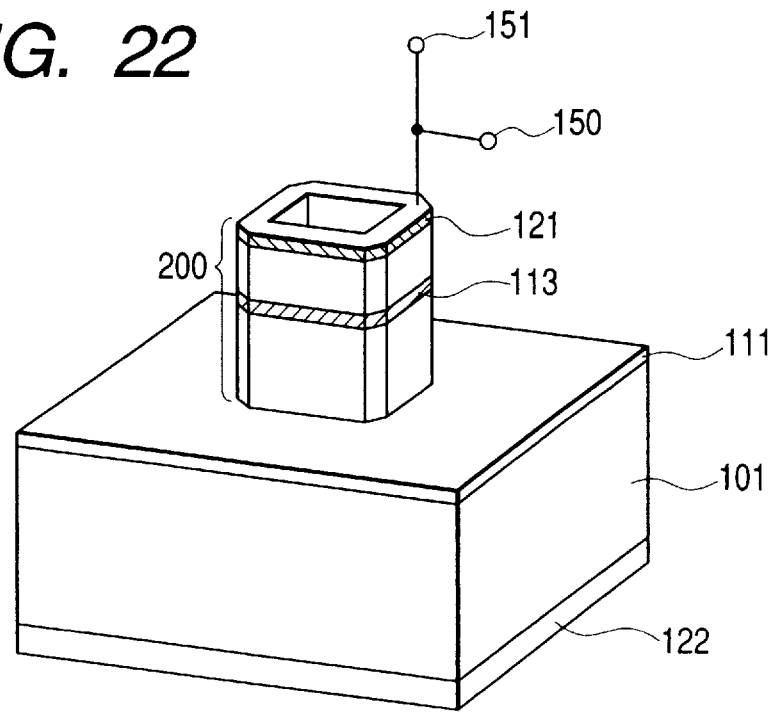
FIG. 22 shows an optical gyro having a hollow cylindrical ring resonator type semiconductor laser according to the invention.

Now, a method of preparing an optical gyro having a hollow ring-resonator type semiconductor laser as schematically shown in FIG. 22 will be described by referring FIGS. 23 through 30.

Figure 23:
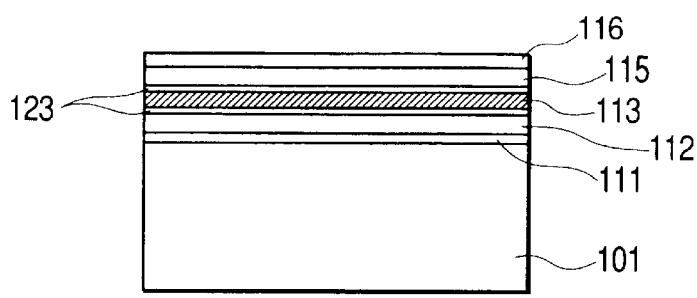
FIGS. 23, 24, 25, 26, 27, 28, 29 and 30 schematically illustrate a process of manufacturing an optical gyro provided with a hollow cylindrical ring resonator type semiconductor laser according to the invention.

Firstly, a substrate having a multilayer structure was brought in. The multilayer substrate includes an active layer 113 having a multi-quantum well structure of three layers of $Al_{0.3}Ga_{0.7}As$/GaAs formed on an n-GaAs substrate 101 with a pair of optical guiding layers 123 of $Al_{0.3}Ga_{0.7}As$ sandwiching the active layer, which were further sandwiched by a cladding layer 115 of p-$Al_{0.5}Ga_{0.5}As$ and another cladding layer 112 of n-$Al_{0.5}Ga_{0.5}As$ (FIG. 23). Reference numeral 111 in FIG. 23 denotes a buffer layer of n-GaAs formed on the substrate 101 and reference numeral 116 denotes a cap layer made of p-GaAs formed on the upper cladding layer 115.

Figure 24:
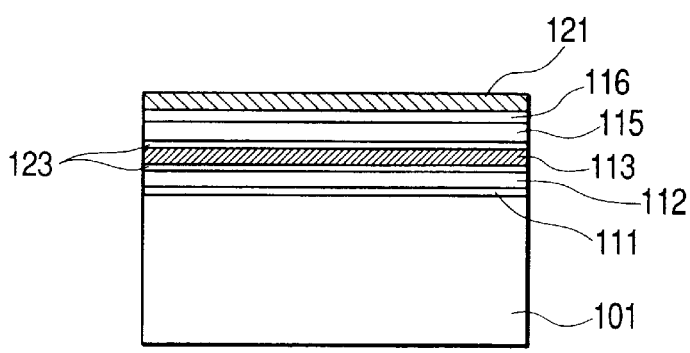
Figure 25:
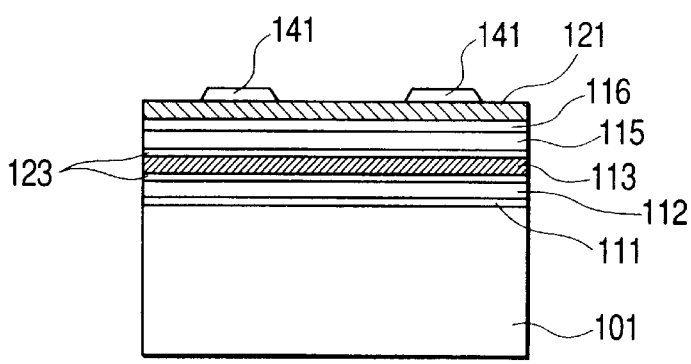
Figure 26:
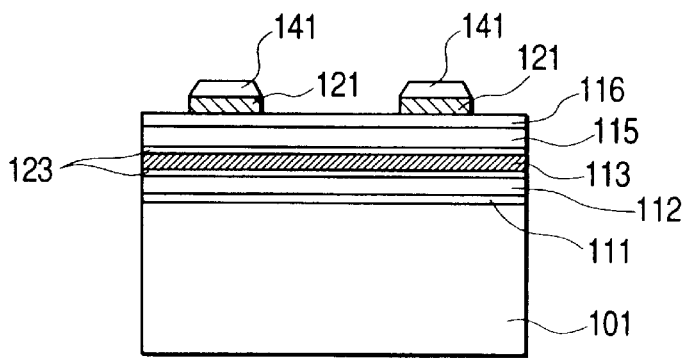
Figure 27:
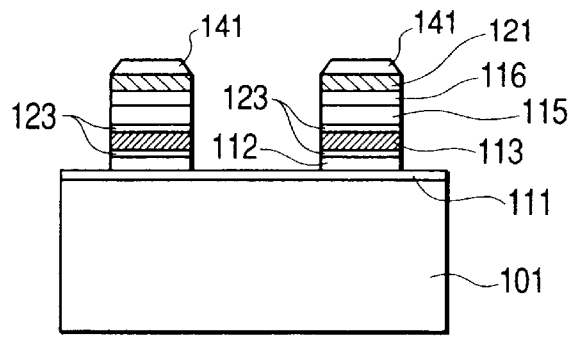

Then, Cr/Au (or Ti/Pt/Au) was formed on the cap layer 116 as an anode 121 (FIG. 24). Thereafter, photoresist 141 was coated thereon and a patterning operation was conducted as shown in FIG. 25. Then, the anode 121 was subjected to a dry etching operation by using the patterned photoresist 141 as a mask (FIG. 26).

Figure 28:
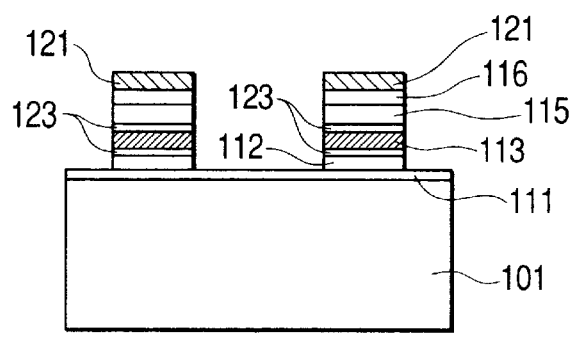
Figure 29:
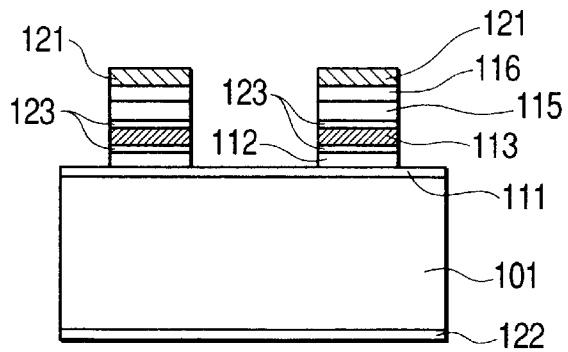
Figure 30:
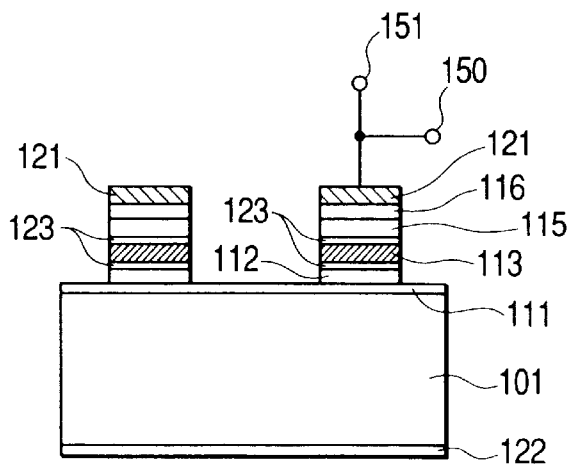

Subsequently, the semiconductor layers were removed by dry-etching (FIG. 27) and the photoresist was peeled-off (FIG. 28). While the buffer layer 111 was left in FIG. 27, it may alternatively be also etched out. After peeling off the photoresist layer, annealing in a hydrogen atmosphere was carried out to turn it into an alloy. After polishing the substrate, a cathode 122 was formed by depositing AuGeNi/Au (FIG. 29). Then, annealing in a hydrogen atmosphere was again carried out to turn it into an alloy. Thereafter, a terminal 150 was arranged to detect the beat signal generated in the semiconductor laser in the form of a change in the electric current, the voltage or the impedance (FIG. 30). The beat signal output from the terminal 150 was detected in the form of a change in the electric current, the voltage or the impedance by means of a detection circuit (not shown).

Thus, an optical gyro having a ring resonator type semiconductor laser 200 as shown in FIG. 22 was formed. Note that FIG. 22 shows only the active layer 113 and the cladding layers sandwiching it and so on are omitted from FIG. 22.

When the waveguide had a width of 5 μm and each lateral side thereof had a length of 400 μm, the oscillation threshold value was 4 mA. When being subjected to a rotation of 30 degrees per second, which was equivalent to a camera shake or vibrations of an automobile, with a drive current of 5 mA, a signal with a voltage having an amplitude of 100 mV and a frequency of 860 Hz was obtained from the electrode terminals. Thus, an optical gyro having a low oscillation threshold current was realized. While the active layer was ring-shaped to reduce the volume of the active layer and to drive the device with a low electric current in this example, a device that can be driven with a low electric current can also be realized by injecting ions such as protons into a central portion of the semiconductor laser to raise the electric resistance so that the electric current may mostly be injected into a peripheral area of the device, without using a hollow cylindrical profile.

When the waveguide was tapered and made asymmetric as shown in FIG. 4, the device produced a beat frequency even when it is held stationary. Then, the device could be used to detect the sense of rotation as well as the angular velocity.

A known F/V converter circuit may be arranged in order to detect a change in the frequency of the terminal voltage of the laser device.

Etching techniques that can be used for forming a mesa structure include wet etching, gas etching, plasma etching, sputter etching and reactive ion etching (RIE) in addition to reactive ion beam etching (RIBE) which was described above.

Materials that can be used for forming the active layer for the purpose of the invention include, among others, GaAs, InP, ZnSe, AlGaAs, InGaAsP, InGaAlP, GaAsP, InGaAsSb, AlGaAsSb, InAsSbP, PbSnTe, GaN, GaAlN, InGaN, InAlGaN, GaInP, GaInAs and SiGe.

The structure of the active layer of a semiconductor laser to be used for the purpose of the invention is not limited to a bulk structure; a single quantum well structure (SQW) or a multi quantum well structure (MQW) may alternatively be used.

If a quantum well type laser is used for the purpose of the invention, it may preferably have a strained quantum well structure. For example, an active layer may be formed by employing eight InGaAsP quantum well layers having a compression strain of about 1% and an InGaAsP barrier layer. Alternatively, an MIS structure may be used for the purpose of the invention.

As for a substrate, any substrate may be used for the purpose of the invention so long as desired materials can be grown on it. Substrates that can be used for the purpose of the invention include substrates of compound semiconductors, such as GaAs substrates, InP substrates, GaSb substrates, InAs substrates, PbTe substrates, GaN substrates, ZnSe substrates, and ZnS substrates in addition to SiC substrates, 4H-SiC substrates, 6H-SiC substrates, sapphire substrates, silicon substrates and SOI substrates.

Techniques that can be used for forming the active layer or the like of a semiconductor laser according to the invention include liquid phase epitaxy (LPE), molecular beam epitaxy (MBE), metal organic vapor phase epitaxy (MOCVD, MOVPE), atomic layer epitaxy (ALE), metal organic molecular beam epitaxy (MOMBE) and chemical beam epitaxy (CBE).

Materials that can be used for the anode of a semiconductor laser according to the invention include Cr/Au, Ti/Pt/Au and AuZn/Ti/Pt/Au. Materials that can be used for the cathode of a semiconductor laser according to the invention include AuGe/Ni/Au and AuSn/Mo/Au.

Note that the present invention is by no means limited to the above listed techniques and materials.

It is also possible to arrange the electrodes reversely relative to those illustrated in the drawings depending on the electric conductivity of the substrate and/or that of the active layer.

More specifically, while the cathode is located under the substrate in the drawings, the anode and the cathode may be arranged reversely relative to those illustrated in the drawings depending on the type of the substrate.

The semiconductor laser chip may preferably be mounted on a heat emitting member (heat sink) in order to protect the semiconductor laser against heat. If used, the heat sink may be made of Cu, Si, SiC, AlN or diamond, although materials that can be used for the heat sink are by no means limited thereto. If necessary, a Peltier device can also be used for controlling the temperature of the device.

An insulation film (coating film) may preferably be formed on the lateral sides of the semiconductor (where light is present) in order to ensure total reflection and/or prevent degradation of the semiconductor laser. Materials that can be used for the insulation film for the purpose of the invention include $SiO_2$, SiN, $Al_2O_3$ and $Si_3N_4$ along with amorphous silicon (α-silicon).

As described above in detail, according to the invention, the top surface of mesa and electrodes can be approximately of the same size to eliminate the need of alignment of a mask. In other words, the present invention provides a method of manufacturing a semiconductor device that involves a self-alignment process for the electrode to be formed on the mesa of the semiconductor optical laser. Thus, a method of manufacturing a semiconductor device according to the invention ensures high positional precision and reduces the number of manufacturing steps.

EXAMPLE 11

An optical switch for switching an optical path can be composed by using photonic crystal. Photonic crystal has a structure where the unit structure of a size substantially equal to an oscillation wavelength (the wavelength of a laser beam with an oscillation wavelength of 0.85 μm in GaAs crystal is 0.85 μm/3.5=0.243 μm) is periodically arranged. Thus, the present invention provides a manufacturing method considerably preferable for electrically controlling such a small structure. Refractive index can be modulated by injecting an electric current in the photonic crystal with forward bias or applying a voltage thereto with reverse bias so that the propagation direction of beams can be modified according to Snell's law.

What is claimed is:

1. A method of manufacturing a semiconductor device comprising the steps of:
   preparing a member having at least one semiconductor layer on a substrate;
   forming an electrode layer on said semiconductor layer;
   forming an etching mask on said electrode layer; and
   forming a mesa profile by etching said electrode layer and said semiconductor layer.

2. A method of manufacturing a semiconductor device according to claim 1, wherein said etching mask is formed after forming a protection film on said electrode layer.

3. A method of manufacturing a semiconductor device according to claim 2, wherein said protection film is selected from the group consisting of an insulation film and a dielectric film.

4. A method of manufacturing a semiconductor device according to claim 1, wherein an electrode layer is formed under the bottom surface of said substrate after forming said mesa profile.

5. A method of manufacturing a semiconductor device according to claim 1, wherein said semiconductor layer is of a multilayer structure.

6. A method of manufacturing a semiconductor device according to claim 1, wherein said semiconductor layer includes a lower cladding layer, an active layer and an upper cladding layer.

7. A method of manufacturing a semiconductor device according to claim 1, further comprising
   the step of removing said etching mask after forming said mesa profile.

8. A method of manufacturing a semiconductor device according to claim 1, wherein the protection film under said etching mask is exposed after etching said electrode layer and said semiconductor layer.

9. A method of manufacturing a semiconductor device according to claim 1, wherein said etching mask is made of photoresist.

10. A method of manufacturing a semiconductor device according to claim 1, wherein said member is a wafer having at least one semiconductor layer.

11. A method of manufacturing a semiconductor optical device comprising:
    a first film forming step of forming at least one semiconductor layer on a substrate;
    a second film forming step of forming a film of a first electrode material on said semiconductor layer;
    a third film forming step of forming a protection film on said first electrode material;
    a step of selectively forming an etching mask;
    a first etching step of selectively etching said protection film;
    a second etching step of selectively etching said first electrode material;
    a third etching step of etching said semiconductor layer to a predetermined depth;
    a step of removing said etching mask and said protection film; and
    a step of forming a second electrode on said substrate.

12. A method of manufacturing a semiconductor optical device according to claim 11, wherein said etching mask is completely removed so as to expose said protection film in a step selected from the group consisting of said second and third etching steps and said protection film is removed subsequent to said third etching step.

* * * * *